US011238921B2

(12) United States Patent
Lee et al.

(10) Patent No.: US 11,238,921 B2
(45) Date of Patent: Feb. 1, 2022

(54) PACKAGED INTEGRATED CIRCUIT MEMORY DEVICES HAVING ENHANCED ON-DIE-TERMINATION CIRCUITS THEREIN AND METHODS OF OPERATING SAME

(71) Applicant: Samsung Electronics Co., Ltd., Suwon-si (KR)

(72) Inventors: Buyeon Lee, Seoul (KR); Taegyeong Kim, Yongin-si (KR); Taesung Kim, Seoul (KR); Byongmo Moon, Seoul (KR)

(73) Assignee: Samsung Electronics Co., Ltd.

( * ) Notice: Subject to any disclaimer, the term of this patent is extended or adjusted under 35 U.S.C. 154(b) by 51 days.

(21) Appl. No.: 16/848,418

(22) Filed: Apr. 14, 2020

(65) Prior Publication Data
US 2021/0020227 A1 Jan. 21, 2021

(30) Foreign Application Priority Data
Jul. 17, 2019 (KR) .................. 10-2019-0086350

(51) Int. Cl.
*G11C 11/4093* (2006.01)
*G06F 3/06* (2006.01)
*H03K 19/00* (2006.01)

(52) U.S. Cl.
CPC ........ *G11C 11/4093* (2013.01); *G06F 3/0659* (2013.01); *H03K 19/0005* (2013.01)

(58) Field of Classification Search
CPC . G11C 11/4093; G11C 7/1084; G11C 7/1057; G11C 5/025; G11C 2207/105; G11C 29/022; G11C 29/028; G11C 7/10; G06F 3/0659; H03K 19/0005
USPC .......................................................... 326/30
See application file for complete search history.

(56) References Cited

U.S. PATENT DOCUMENTS

| 8,076,954 | B2 | 12/2011 | Murayama et al. |
|---|---|---|---|
| 8,710,862 | B2 | 4/2014 | Ferolito et al. |
| 9,524,118 | B2 | 12/2016 | Butterfield |
| 9,608,631 | B2 | 3/2017 | Lee et al. |
| 9,747,230 | B2 | 8/2017 | Han et al. |
| 9,948,299 | B2 | 4/2018 | Bains et al. |
| 10,014,860 | B2 | 7/2018 | Shaeffer |
| 2012/0113733 | A1* | 5/2012 | Kim ........................ G11C 5/063 365/193 |
| 2012/0195148 | A1* | 8/2012 | Yoko ...................... G11C 11/408 365/219 |

(Continued)

*Primary Examiner* — Don P Le
(74) *Attorney, Agent, or Firm* — Myers Bigel, P.A.

(57) ABSTRACT

A memory device includes a pad region having a flag pad separated from an external host, and a signal pad connected to the external host. A bank region is provided having a plurality of memory cells therein. An on-die-termination (ODT) setting circuit is provided, which is configured to receive a control command including first data corresponding to termination resistance requested by the host, and a ODT enable signal. The setting circuit is configured to generate second data corresponding to the ODT resistance. An ODT enable circuit is provided, which is configured to output an ODT flag signal to the flag pad, in response to the control command and the ODT enable signal. A resistor circuit is provided, which is configured to connect the ODT resistance to the signal pad using the second data.

19 Claims, 19 Drawing Sheets

(56) References Cited

U.S. PATENT DOCUMENTS

| | | | |
|---|---|---|---|
| 2016/0148654 A1* | 5/2016 | Sohn | G11C 7/1063 |
| | | | 365/189.07 |
| 2018/0040361 A1* | 2/2018 | Kwon | G11C 11/4074 |
| 2018/0053567 A1* | 2/2018 | Kim | G11C 29/022 |
| 2018/0158495 A1* | 6/2018 | Jeon | H01L 25/0657 |
| 2019/0139585 A1 | 5/2019 | Kim et al. | |
| 2019/0147927 A1* | 5/2019 | Jeon | H03L 7/0802 |
| | | | 365/194 |
| 2021/0020227 A1* | 1/2021 | Lee | G11C 29/028 |
| 2021/0132825 A1* | 5/2021 | Song | G06F 3/0673 |

* cited by examiner

PACKAGED INTEGRATED CIRCUIT MEMORY DEVICES HAVING ENHANCED ON-DIE-TERMINATION CIRCUITS THEREIN AND METHODS OF OPERATING SAME

REFERENCE TO PRIORITY APPLICATION

This application claims priority to Korean Patent Application No. 10-2019-0086350, filed Jul. 17, 2019, the disclosure of which is hereby incorporated herein by reference in its entirety.

BACKGROUND

The present inventive concept relates to packaged integrated circuit devices and, more particularly, to packaged multi-bank memory devices and methods of operating same.

A memory device may be capable of storing and outputting data, and may be applied to various fields. In order to improve the degree of integration, a memory package including a plurality of memory devices may be mounted on an electronic device, and various operating methods for simultaneously driving two or more memory devices in the memory package to thereby improve operating speed and/or power consumption may be adopted. In order to prevent deterioration in performance of the memory device in high-speed operations, it is necessary to minimize signal distortion and ensure signal integrity.

SUMMARY

An aspect of the present inventive concept is to provide a memory device and a memory package for setting on-die-termination (ODT) resistance to minimize distortion of a signal transmitted/received between the memory device, and a host, a memory controller, or the like.

According to an aspect of the present inventive concept, a memory device includes a pad region having a flag pad separated from an external host, and a signal pad connected to the external host. A memory bank region is provided having a plurality of memory cells therein. An on-die-termination (ODT) setting circuit is provided, which is configured to receive a control command including first data corresponding to termination resistance requested by the external host, and an ODT enable signal, and is further configured generate second data corresponding to ODT resistance. An ODT enable circuit is provided, which is configured to output an ODT flag signal to the flag pad, in response to the control command and the ODT enable signal. A resistor circuit is provided, which is configured to connect the ODT resistance to the signal pad using the second data.

According to an aspect of the present inventive concept, a memory package includes a package substrate having a plurality of pads. A first memory device is mounted on the package substrate. This first memory device includes a first on-die-termination (ODT) resistance and a first ODT circuit, which determines a value of the first ODT resistance. The first ODT circuit sets the first ODT resistance as a first resistance value and outputs an ODT flag signal, in response to an ODT request from a host. A second memory device is mounted on the package substrate, and includes a second ODT resistance and a second ODT circuit, which determines a value of the second ODT resistance. In particular, the second ODT circuit is configured to set the second ODT resistance at a second resistance value when receiving the ODT flag signal from the first memory device.

According to an aspect of the present inventive concept, a memory device includes a resistor circuit, which provides on-die-termination (ODT) resistance that is connected to a pad receiving a signal from an external host. An ODT setting circuit is provided, which is configured to control the resistor circuit such that the ODT resistance has a value greater than a termination resistance, when the termination resistance included in an ODT request received from the host is lower than predetermined reference resistance. An ODT enable circuit is provided, which is configured to output an ODT flag signal when the termination resistance is lower than the reference resistance. This ODT enable circuit is configured to output the ODT flag signal to a first number of the memory device, among other memory devices, when the ODT request is received together with at least one signal of a command/address signal and a clock signal, and output the ODT flag signal to a second number of the memory device, among other memory devices, when the ODT request is received together with at least one signal of a data signal and a data strobe signal. The second number may be less than the first number.

According to an additional embodiment of the invention, a packaged integrated circuit device is provided with a plurality of integrated circuits, which have respective on-die-termination (ODT) circuits therein. The ODT circuits having respective inputs that are: (i) commonly connected to a terminal of the packaged integrated circuit device, and (ii) collectively provide a parallel-connected array of resistors between the terminal and a reference potential, which has an adjustable net resistance. In addition, responsive to a first ODT request issued by a host external to the packaged integrated circuit device, a first of the plurality of integrated circuits transmits a flag signal to the other ones of the plurality of integrated circuits. An adjustment of the net resistance is responsive (e.g., synchronized) to the transmission of the flag signal.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, preferred embodiments of the present inventive concept will be described with reference to the accompanying drawings.

Figure 1:
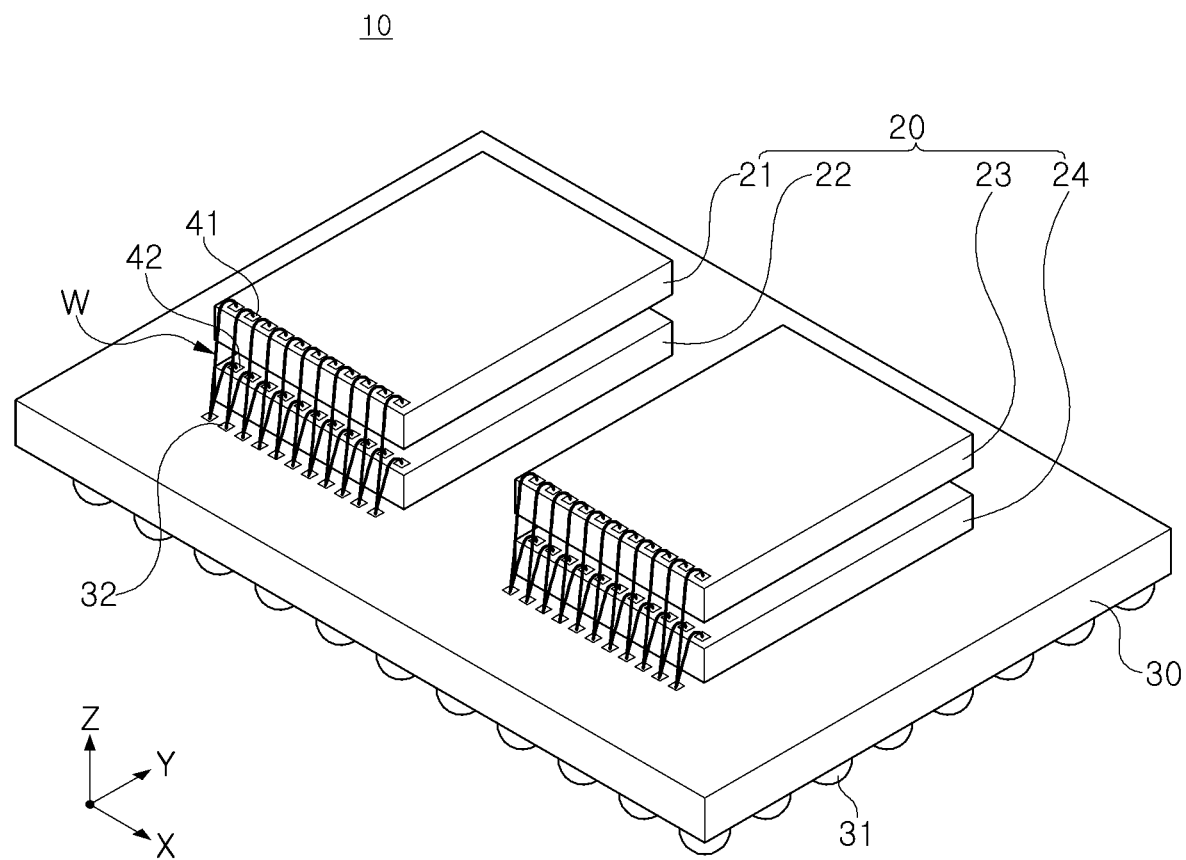
FIG. 1 is a view schematically illustrating a memory package according to an embodiment of the present inventive concept.

FIG. 1 is a view schematically illustrating a memory package according to an embodiment of the present inventive concept. Referring to FIG. 1, a memory package 10 according to an embodiment of the present inventive concept may include a plurality of memory devices 20, i.e., 21 to 24, and a package substrate 30 on which the plurality of memory devices 20 may be mounted. For example, the plurality of memory devices 20 may be mounted on an upper surface of the package substrate 30, and a plurality of bumps (e.g., solder balls) 31 for transmitting and receiving a signal and electric power may be formed on a lower surface of the package substrate 30.

In an embodiment, each of the plurality of memory devices 20 may be a dynamic random access memory (DRAM) device. At least a portion of the plurality of memory devices 20 may be stacked on each other on the package substrate 30. In the embodiment illustrated in FIG. 1, a first memory device 21 and a second memory device 22 may be stacked on each other as a first pair of DRAM chips, and a third memory device 23 and a fourth memory device 24 may be stacked on each other as a second pair of DRAM chips. The number of the plurality of memory devices 20 included in the semiconductor package 10, their arrangement on the package substrate 30, their mounting form, and the like may be variously modified in accordance with embodiments.

At least a portion of the plurality of memory devices 20 may share pads for sending and/or receiving a signal and/or electric power. Referring to FIG. 1, pads 41 and 42 formed in the first memory device 21 and the second memory device 22, respectively, may be electrically connected to substrate pads 32. The third memory device 23 and the fourth memory device 24 may be connected to the package substrate 30 in a manner similar to the first memory device 21 and the second memory device 22.

In the embodiment illustrated in FIG. 1, when a data signal and a data strobe signal are input to and output from at least one of the first memory device 21 and the second memory device 22, the first memory device 21 and the second memory device 22 may be simultaneously driven by a host. When a data signal and a data strobe signal are input to and output from at least one of the third memory device 23 and the fourth memory device 24, the third memory device 23 and the fourth memory device 24 may be simultaneously driven by a host. When inputting/outputting a command/address signal, a clock signal, and the like, the first to fourth memory devices 20 may be simultaneously driven by a host. Depending on capacity, channel configuration, and the like of the memory package 10, the memory package 10 may operate in different manner to the above.

For example, when the host transmits an on-die-termination (ODT) request to the first memory device 21 to input a command/address signal to the memory devices 20, only ODT resistance of the first memory device 21 may be connected to a pad to which the command/address signal is input. Since the host simultaneously drives the memory devices 20, the signal may be reflected in the second to fourth memory devices 22 to 24 that do not connect ODT resistance to the pad to which the command/address signal is input. As described above, the reflection of signals occurring in the memory devices that are not connected by the ODT resistance to the pad to which the signal is input may reduce eye margin of the signal and deteriorate the signal integrity.

In an embodiment of the present inventive concept, when two or more memory devices are being simultaneously driven by a host, remaining memory devices, other than the memory devices receiving the ODT request from the host, may also connect ODT resistance to a pad to which a signal is input. Therefore, the eye margin of the signal and the signal integrity may be improved by minimizing the reflection of signals occurring in the memory devices that have not received the ODT request directly from the host. For example, the memory device that have received the ODT request from the host may determine whether to request connection of the ODT resistance to the remaining memory devices being simultaneously driven, or not, in consideration of a type of a signal input from the host, an operating frequency, a value of termination resistance included in the ODT request.

Figure 2:
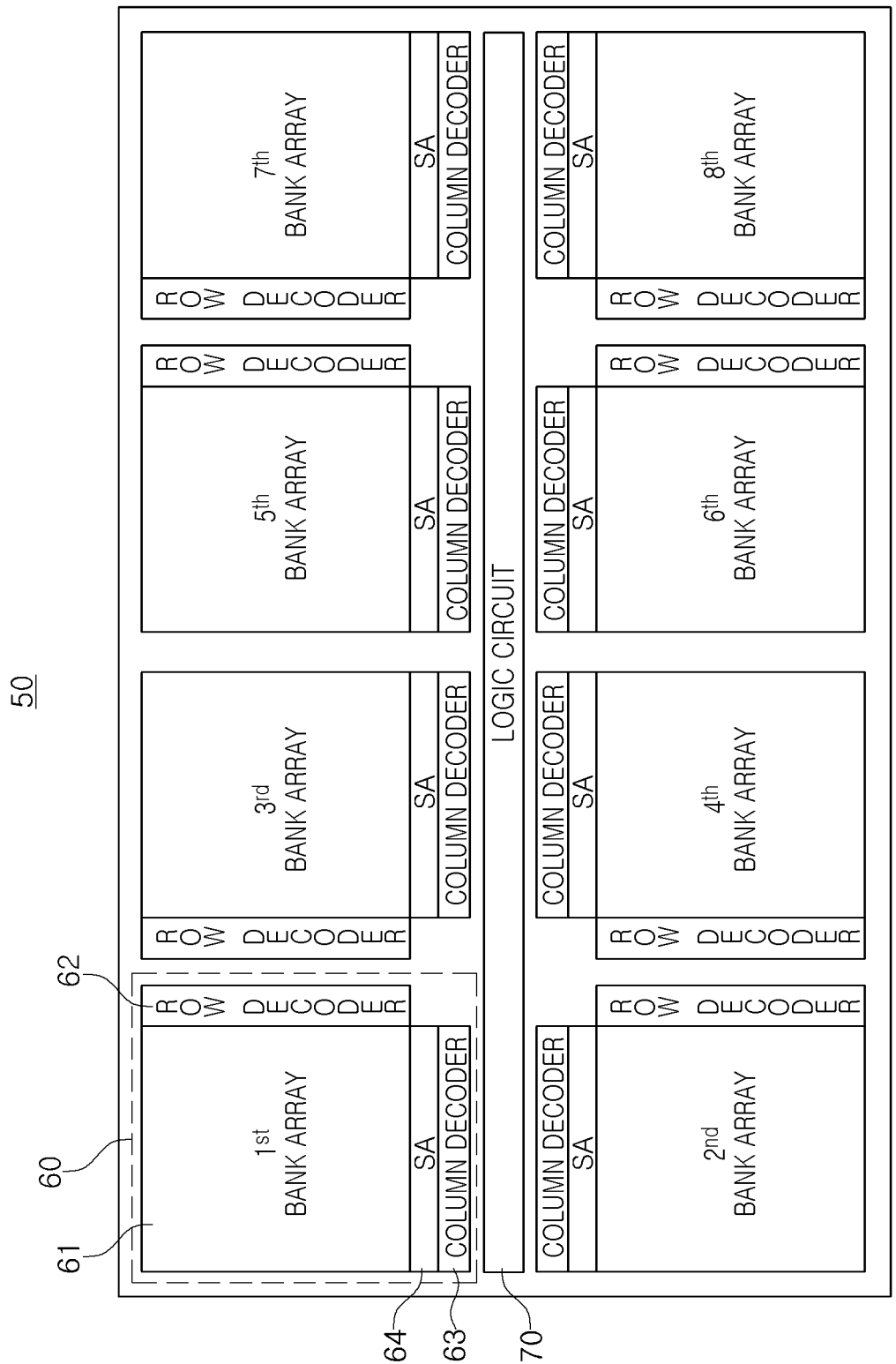
FIG. 2 is a view schematically illustrating a memory device according to an embodiment of the present inventive concept.

FIG. 2 is a view schematically illustrating a memory device according to an embodiment of the present inventive concept. Referring to FIG. 2, a memory device 50 according to an embodiment of the present inventive concept may include a plurality of memory banks 60, and a logic circuit 70. Each of the plurality of memory banks 60 may include a bank array 61 having a plurality of memory cells, a row decoder 62, a column decoder 63, a sense amplifier 64, and the like. In an embodiment, a portion of the plurality of memory banks 60 may be grouped into a single group.

The plurality of memory banks 60 included in the memory device 50 may share the logic circuit 70. The logic circuit 70 may specify an address for reading data from the bank array 61 or storing data in the bank array 61, or may determine an operation mode of the memory device 50. The logic circuit 70 may include input/output pads for transmitting data to be stored in the plurality of memory banks 60 and data output from the plurality of memory banks 60. In an example, the logic circuit 70 may control the plurality of memory banks 60 in response to a control command received from an external host or the like.

In an embodiment of the present inventive concept, the logic circuit 70 may include an ODT circuit capable of setting ODT resistance, connected to the pad. An operation of the ODT circuit may vary, depending on whether the memory device 50 receives an ODT request from the host. In an example, when the memory device 50 receives the ODT request from the host, the ODT circuit may use a control command included in the ODT request to set the ODT resistance of the memory device 50 as a predetermined resistance value. Also, when the memory device 50 receives the ODT request from the host, the ODT circuit may output an ODT flag signal for activating the ODT resistance of the other memory device being simultaneously driven, in response to a control command and an ODT enable signal received from the host.

When the memory device 50 does not receive the ODT request from the host, the ODT circuit may activate the ODT resistance, depending on whether the ODT flag signal is transmitted from the other memory device. When the ODT flag signal is transmitted from the other memory device driven together with the host, the ODT circuit of the memory device 50 may connect the ODT resistance to a pad communicating with the host, regardless of whether it has received the ODT request from the host. Therefore, since the memory device 50 does not connect the ODT resistance to the pad communicating with the host, the reflection of signals occurring therein may be minimized and the signal integrity, including the eye margin, and the like may be improved.

Figure 3:
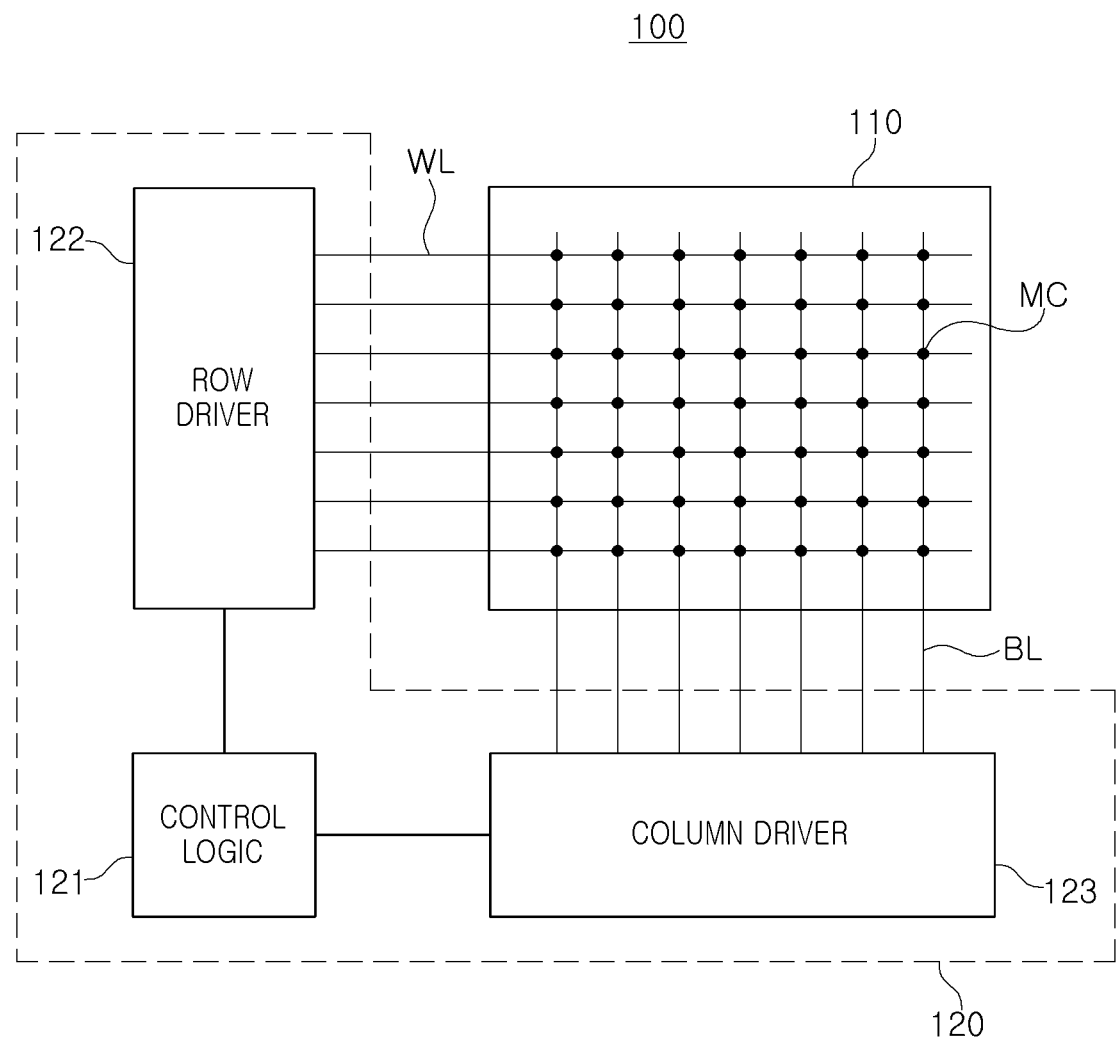
FIGS. 3 and 4 are views schematically illustrating a memory device according to an embodiment of the present inventive concept.
Figure 4:
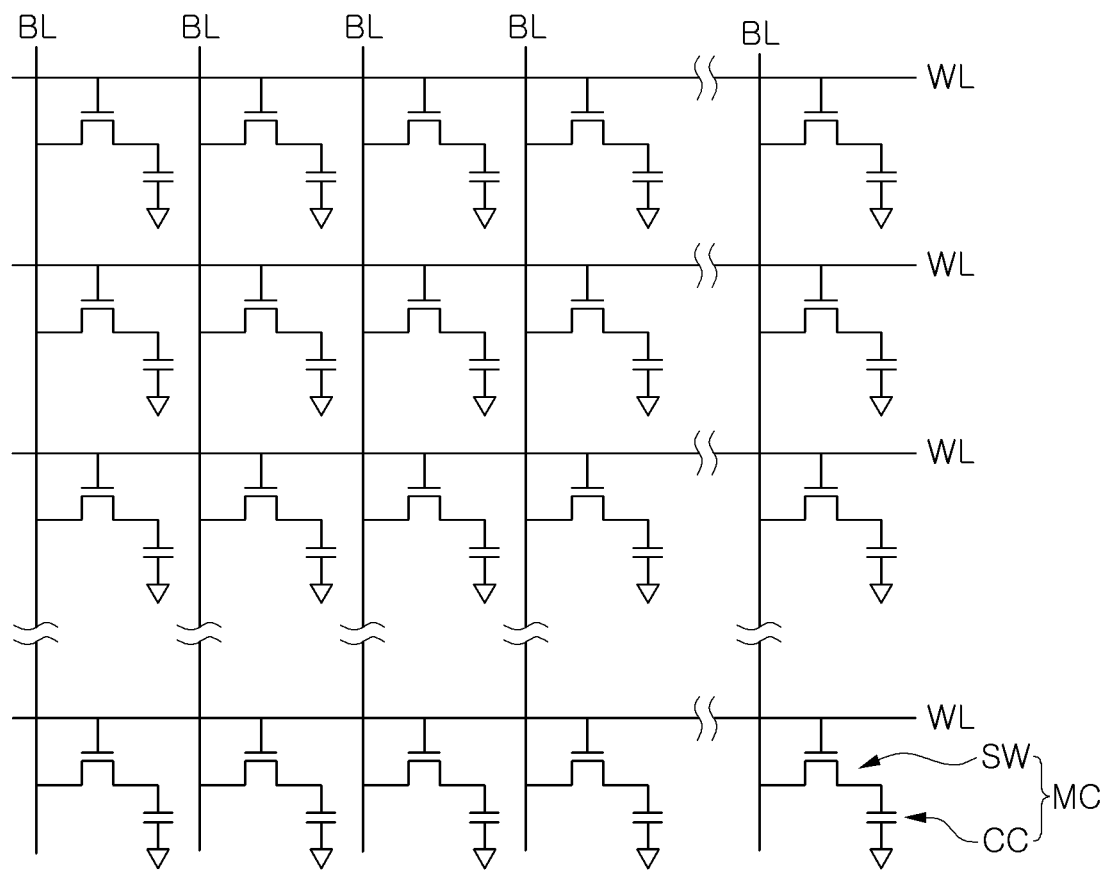

FIGS. 3 and 4 are views schematically illustrating a memory device according to an embodiment of the present inventive concept. FIG. 3 is a simplified block diagram illustrating an internal structure of a memory device 100 in accordance with an embodiment of the present inventive concept. For example, in an embodiment illustrated in FIG. 3, a memory device 100 may correspond to one of the plurality of memory banks 60 included in the memory device 50 in the embodiment illustrated in FIG. 2.

Referring to FIG. 3, a memory device 100 according to an embodiment of the present inventive concept may include a bank array 110, a controller 120, and the like. In an embodiment, the controller 120 may be a concept including a control logic 121, a row driver 122, and a column driver 123, and the bank array 110 may include a plurality of memory cells MC.

In an embodiment, the row driver 122 may be connected to the memory cells MC via respective word lines WL, and the column driver 123 may be connected to the memory cells MC via respective bit lines BL. The row driver 122 may select a memory cell MC in or from which data is to be written into or read from, and the column driver 123 may include a read/write circuit for writing data in a memory cell MC or reading data from the memory cell MC. Operations of the row driver 122 and the column driver 123 may be controlled by the control logic 121.

Referring next to FIG. 4, a bank array 110 according to an embodiment of the present inventive concept may include a plurality of memory cells MC. The memory cells MC may be provided adjacent regions intersecting a plurality of word lines WL and a plurality of bit lines BL. For example, each of the memory cells MC may be connected to one of the plurality of word lines WL and one of the plurality of bit lines BL.

Each of the memory cells MC may include a switch element SW and a storage capacitor CC. In an embodiment, the switch element SW may include a transistor, a gate terminal of the transistor may be connected to the word line WL, and drain/source terminals of the transistor may be connected to the bit line BL and the storage capacitor CC, respectively.

The memory device may respectively write or erase data by charging the storage capacitor CC included in each of the plurality of memory cells MC, or by discharging the electric charges in the storage capacitor CC, via the plurality of word lines WL and the plurality of bit lines BL. Further, the memory device may read data from each of the plurality of memory cells MC by reading a voltage of the storage capacitor CC, and the like. In an embodiment, the memory device may periodically perform a refresh operation for rewriting data in the plurality of memory cells MC such that no electric charge charged in the storage capacitor CC is excessively discharged and no data is lost.

Figure 5:
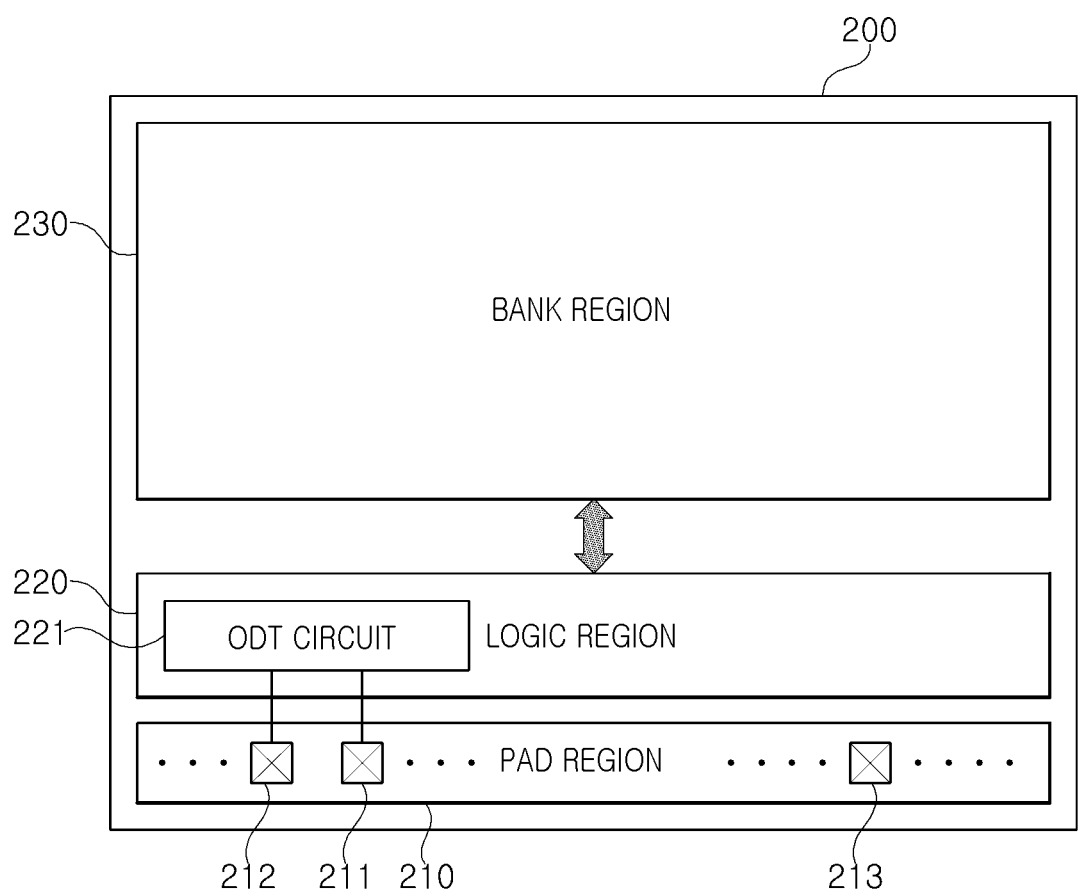
FIG. 5 is a view schematically illustrating a memory device according to an embodiment of the present inventive concept.

FIG. 5 is a view schematically illustrating a memory device according to an embodiment of the present inventive concept. Referring to FIG. 5, a memory device 200 according to an embodiment of the present inventive concept may include a pad region 210, a logic region 220, and a bank region 230. The bank region 230 may include a plurality of memory banks, and each of the plurality of memory banks may include memory cells connected to word lines and bit lines.

The logic region 220 may include circuits for controlling the memory cells, and an ODT circuit 221. In an embodiment, the ODT circuit 221 may be connected to a signal pad 211 and a flag pad 212, included in the pad region 210. The signal pad 211 may be one of pads for transmitting and receiving a signal to and from an external host. In an embodiment, the memory device 200 may transmit and receive at least one of a command/address signal, a clock signal, a data signal, and a data strobe signal to and from the host via the signal pad 211.

The flag pad 212 may be a pad for the ODT circuit 221 to communicate with an ODT circuit included in the other memory device. For example, the flag pad 212 may be connected to a flag pad of the other memory device, in addition to the memory device 200, included in one memory package, and may not be connected to the host. For example, the ODT circuit 221 may output an ODT flag signal to an ODT circuit included in the other memory device via the flag pad 212, or may receive an ODT flag signal from an ODT circuit included in the other memory device.

An operation of the ODT circuit 221 may be determined, depending on whether the memory device 200 receives an ODT request from the host. In an embodiment, the ODT request received by the memory device 200 from the host may include a control command including first data corresponding to termination resistance requested by the host, an ODT enable signal, and the like. When the memory device 200 receives the ODT request, the ODT circuit 221 may connect ODT resistance to the signal pad 211.

The ODT resistance may be equal to or different from the termination resistance requested by the host. In an example, when the ODT circuit 221 outputs the ODT flag signal to the flag pad 212, the ODT resistance may be different from the termination resistance requested by the host. In an embodiment, the ODT circuit 221 may output the ODT flag signal, when the termination resistance requested by the host is lower than predetermined reference resistance. When the ODT circuit 221 does not output the ODT flag signal to the flag pad 212, the ODT resistance may be equal to the termination resistance requested by the host. In an embodiment, the ODT circuit 221 may not output the ODT flag signal, when the termination resistance requested by the host is equal to or higher than predetermined reference resistance.

When the memory device 200 does not receive the ODT request, the ODT circuit 221 may determine whether the ODT flag signal is transmitted from the other memory device via the flag pad 212. When the ODT flag signal is not transmitted, the ODT circuit 221 may not connect the ODT resistance to the signal pad 211. When the ODT flag signal is transmitted, the ODT circuit 221 may connect the ODT resistance, set as a previously stored resistance value, to the signal pad 211. For example, the ODT resistance, set as the previously stored resistance value, may be higher than the termination resistance included in the ODT request received by the other memory device from the host.

Figure 6:
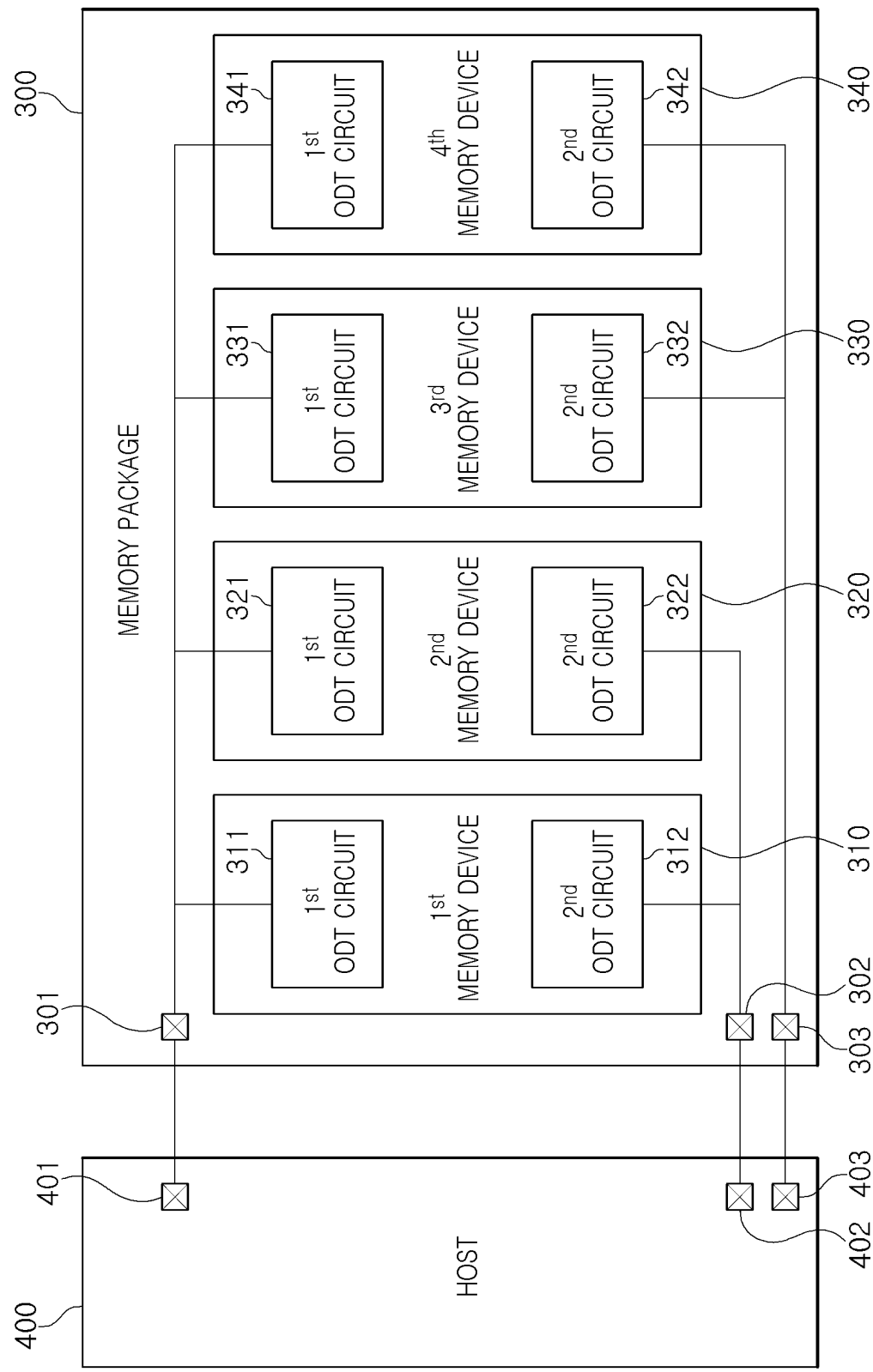
FIGS. 6 to 8 are views illustrating an operation of a memory package according to an embodiment of the present inventive concept.
Figure 7:
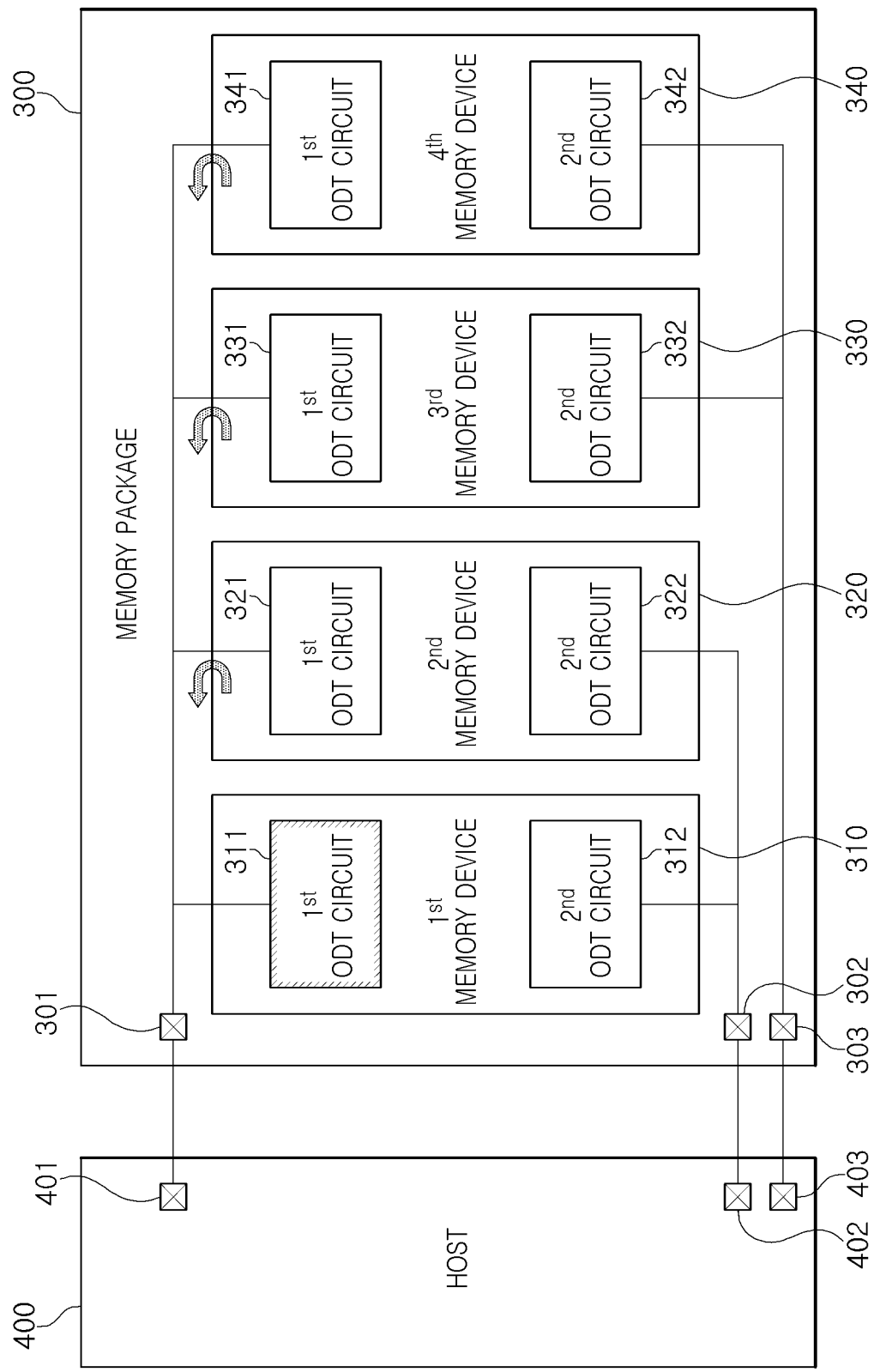
Figure 8:
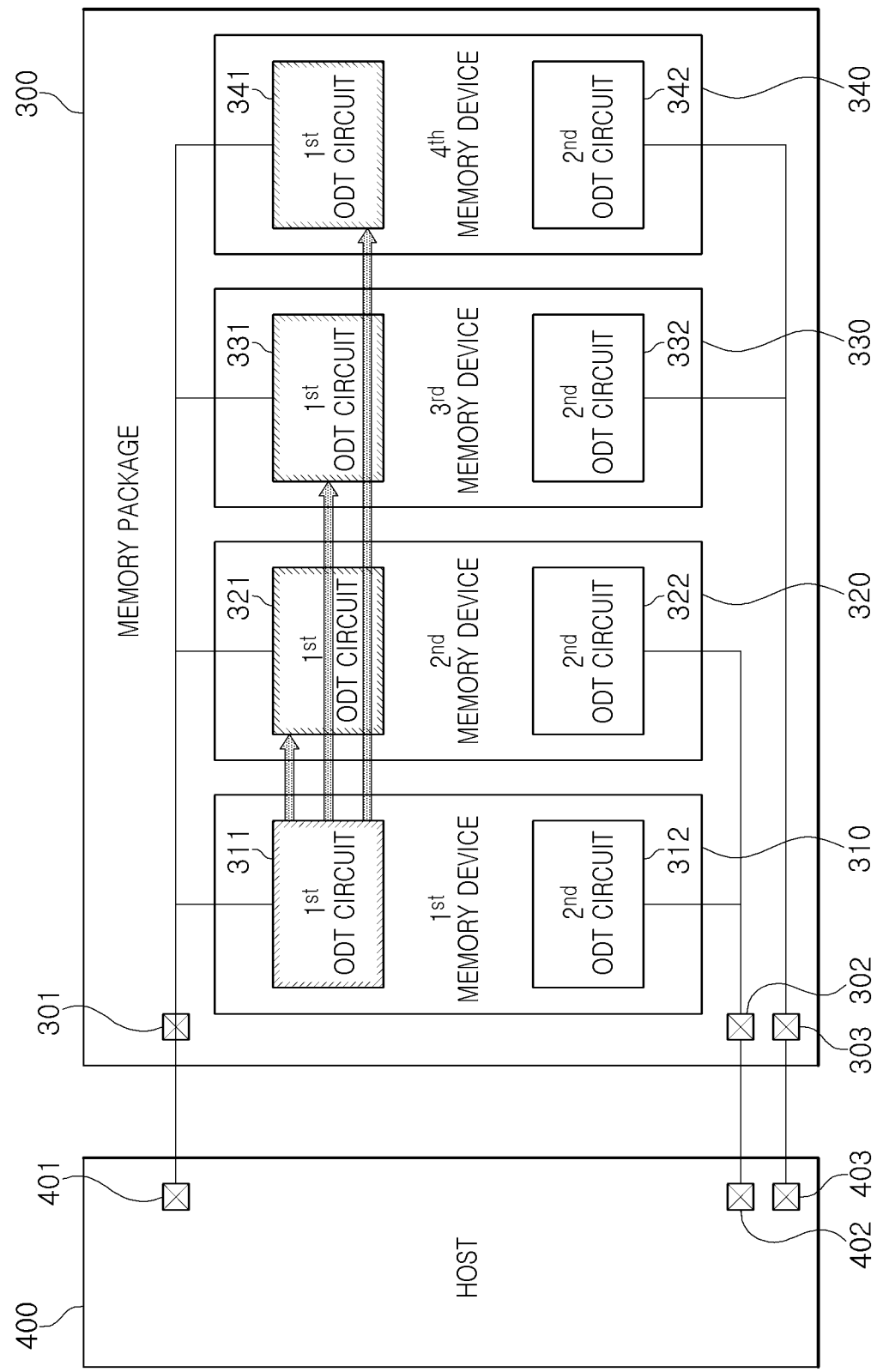

FIGS. 6 to 8 are views illustrating an operation of a memory package according to an embodiment of the present inventive concept. Referring to FIG. 6, a memory package 300 according to an embodiment of the present inventive concept may include a plurality of memory devices 310 to 340. The memory package 300 may be operated by a control command transmitted by a host 400, and the control command may include a command/address signal, a data signal, a data strobe signal, or the like. The number of memory devices 310 to 340 included in the memory package 300 may be variously changed, depending on embodiments.

The memory devices 310 to 340 may have the same architecture. For example, a first memory device 310 may include a first ODT circuit 311 and a second ODT circuit 312. The first ODT circuit 311 may be connected to a first pad 301 of the memory package 300, and the second ODT circuit 312 may be connected to a second pad 302 of the memory package 300. For example, the first pad 301 and the second pad 302 may be pads for inputting and outputting different signals from each other.

Moreover, the first pad 301 may be shared by the first to fourth memory devices 310 to 340. Referring to FIG. 6, first ODT circuits 311, 321, 331, and 341 of the first to fourth memory devices 310 to 340 may be connected to the first pad 301 in common. In an embodiment, the first pad 301 may be a pad for inputting/outputting a command/address signal, a clock signal, or the like.

The second pad 302 may be shared by the first and second memory devices 310 and 320. Referring to FIG. 6, second ODT circuits 312 and 322 of the first and second memory devices 310 and 320 may be connected to the second pad 302. In addition, second ODT circuits 332 and 342 of the third and fourth memory devices 330 and 340 may be connected to a third pad 303 in common. In an embodiment, the second pad 302 and the third pad 303 may be pads for inputting/outputting signals different from those of the first pad 301. For example, a data signal, a data strobe signal, or the like may be input/output through the second pad 302 and the third pad 303. The first to third pads 301 to 303 of the memory package 300 may be connected to first to third pads 401 to 403 of the host 400.

The host 400 may determine one of the memory devices 310 to 340 as a selection device, and may output a command/address signal to the first pad 401. The command/address signal may be input to the first pad 301 of the memory package 300, and the memory devices 310 to 340 connected to the first pad 301 may be connected as a load for the command/address signal.

Referring to FIG. 7, in a general operation of the memory package 300, only a memory device that receives an ODT request from the host 400, among the memory devices 310 to 340, may activate ODT resistance and may be connected to the first pad 301. For example, when the host 400 transmits the ODT request to the first memory device 310, only the first ODT circuit 311 of the first memory device 310 may connect the ODT resistance to the first pad 301. The first ODT circuits 321, 331, and 341 of the second to fourth memory devices 320 to 340 may be not activated and may not connect the ODT resistance to the first pad 301. Therefore, since reflection in a signal may occur in the second to fourth memory devices 320 to 340, and the command/address signal transmitted from the host 400 may be distorted, signal integrity may be deteriorated.

Accordingly, to resolve these potential signal distortion problems, the embodiments of the present inventive concept operate so that when the host 400 transmits the ODT request to the first memory device 310, the first ODT circuit 311 of the first memory device 310 may also activate the first ODT circuits 321, 331, and 341 of the second to fourth memory devices 320 to 340. For example, the first ODT circuit 311 may operate as a master device for the remaining first "slave" ODT circuits 321, 331, and 341.

Referring to FIG. 8, the first ODT circuit 311 of the first memory device 310 receiving the ODT request from the host 400 may determine whether the slave ODT circuits 321, 331, and 341 in the second to fourth memory devices 320 to 340, driven together with the first memory device 310, are activated, with reference to an operating frequency of the memory package 300, or the like. For example, when the operating frequency of the memory package 300 is higher than a predetermined reference frequency, the first ODT circuit 311 of the first memory device 310 may activate the salve ODT circuits 321, 331, and 341 of the second to fourth memory devices 320 to 340.

In the embodiment illustrated in FIG. 8, the first ODT circuit 311 of the first memory device 310 receiving the ODT request from the host 400 may generate an ODT flag signal, and may transmit the ODT flag signal to the slave ODT circuits 321, 331, and 341 of the second to fourth memory devices 320 to 340. The slave ODT circuits 321, 331, and 341 of the second to fourth memory devices 320 to 340 may connect the ODT resistance to the first pad 301, in response to the ODT flag signal, and may set the ODT resistance as a predetermined resistance value.

For example, the slave ODT circuits 321, 331, and 341 of the second to fourth memory devices 320 to 340 may set the ODT resistance, connected to the first pad 301, as a previously stored value. The ODT resistance connected to the first pad 301 by the first ODT circuit 311 may be set as a value such that an overall combined resistance of ODT resistances connected to the first pad 301 by the first ODT circuits 311 to 341 may be consistent with a desired termination resistance included in the ODT request from the host 400.

For example, when the termination resistance requested by the host 400 is set to be 40 ohms, and the slave ODT circuits 321, 331, and 341 of the second to fourth memory devices 320 to 340 are set to have ODT resistance of 240 ohms, the first ODT circuit 311 of the first memory device 310 may set its ODT resistance to be 80 ohms (because 80μ240μ240μ240=80μ240μ120=80μ80=40 ohms). Alternatively, when the termination resistance requested by the host 400 is 60 ohms, and the slave ODT circuits 321, 331, and 341 of the second to fourth memory devices 320 to 340 are set to have the ODT resistance of 240 ohms, the first ODT circuit 311 of the first memory device 310 may set the ODT resistance to have 240 ohms (because 240∥240∥240μ240=120μ120=60 ohms).

Figure 9:
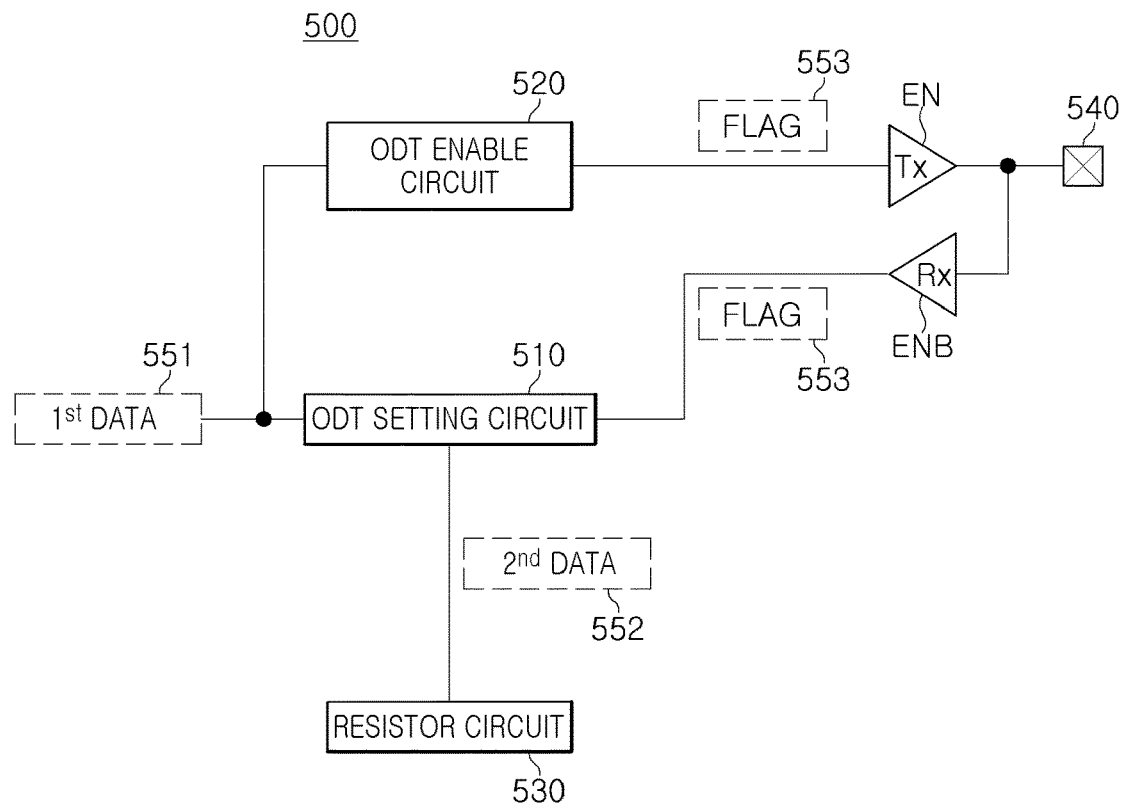
FIG. 9 is a view illustrating an operation of a memory device according to an embodiment of the present inventive concept.

FIG. 9 is a view illustrating an operation of a memory device according to an embodiment of the present inventive concept. FIG. 9 is a view illustrating an ODT circuit 500 included in a memory device according to an embodiment of the present inventive concept. For example, the ODT circuit 500 may be included in a logic region of the memory device. Referring to FIG. 9, the ODT circuit 500 may include an ODT setting circuit 510, an ODT enable circuit 520, a resistor circuit 530, and the like. The ODT circuit 500 may also include a transmitter Tx and a receiver Rx, sharing a flag pad 540, and the transmitter Tx and the receiver Rx may not be activated at the same time.

The transmitter Tx may be activated such that the memory device including the ODT circuit 500 receives an ODT request from a host. In an example, the transmitter Tx may be turned on by an ODT enable signal (EN) included in the ODT request. The receiver Rx may be activated, when the memory device including the ODT circuit 500 does not receive the ODT request from the host. The receiver Rx may be turned on by an inverted ODT enable signal (ENB). Hereinafter, an operation in a case in which the memory device including the ODT circuit 500 receives the ODT request from the host will be described.

When the memory device including the ODT circuit 500 receives the ODT request, the ODT enable signal (EN) may turn on the transmitter Tx and may turn off the receiver Rx. The ODT circuit 500 may receive first data 551, transmitted together with the ODT request. The first data 551 may be included in a mode register MR command and may be transmitted. For example, the first data 551 may be generated by a memory controller included in a host such as an application processor, a central processing unit, a system-on-chip, and the like, and may be input to the ODT circuit 500. The first data 551 may correspond to termination resistance "data" requested by the host.

The termination resistance "data" included in the first data 551 may be determined by the host, and may vary depending on an operating frequency of the memory device. For example, when the operating frequency of the memory device is higher than a predetermined reference frequency, the termination resistance may be lower than the predetermined reference resistance. When the operating frequency is equal to or lower than the reference frequency, the termination resistance may be equal to or higher than the reference resistance. For example, when the operating frequency is relatively high, the host may request relatively lower termination resistance in the memory device. When the operating frequency is relatively low, the host may request relatively high termination resistance in the memory device.

In an example, the ODT setting circuit 510 may generate second data 552 by comparing the termination resistance included in the first data 551 with a predetermined reference resistance. The second data 552 may include data corresponding to ODT resistance provided by the resistor circuit 530. In an embodiment, when the termination resistance included in the first data 551 is lower than the reference resistance, the ODT setting circuit 510 may generate second data 552 corresponding to the ODT resistance, different from the termination resistance, and may transmit the second data 552 to the resistor circuit 530. When the termination resistance included in the first data 551 is equal to or higher than the reference resistance, the ODT setting circuit 510 may generate second data 552 corresponding to the ODT resistance, such as the termination resistance, and may transmit the second data 552 to the resistor circuit 530. For example, when the termination resistance included in the first data 551 is equal to or higher than the reference resistance, the first data 551 and the second data 552 may be the same. The resistor circuit 530 may determine the ODT resistance with reference to the second data 552, and the ODT resistance may be connected to a pad for transmitting and receiving a signal to and from the host.

When the termination resistance included in the first data 551 is lower than the reference resistance, the ODT enable circuit 520 may output an ODT flag signal 553 via the transmitter Tx. The ODT flag signal 553 may be a one-bit flag signal, and may be transmitted to an ODT circuit of the other memory device that has not received the ODT request via the flag pad 540 from the host. The other memory device may be a memory device that may be driven together with the memory device including the ODT circuit 500 by the host.

Next, an operation in a case in which the memory device including the ODT circuit 500 does not receive the ODT request from the host will be described. When the memory device including the ODT circuit 500 does not receive the ODT request from the host, the first data 551 may not be input to the ODT circuit 500, and the ODT enable circuit 520 may not operate.

Further, the inverted ODT enable signal (ENB) may turn on the receiver Rx and may turn off the transmitter Tx. When the receiver Rx receives the ODT flag signal 553 from the other memory device via the flag pad 540, the ODT setting circuit 510 may generate second data 552 and may transmit the second data 552 to the resistor circuit 530. The second data 552 may include data corresponding to previously stored ODT resistance.

Figure 10:
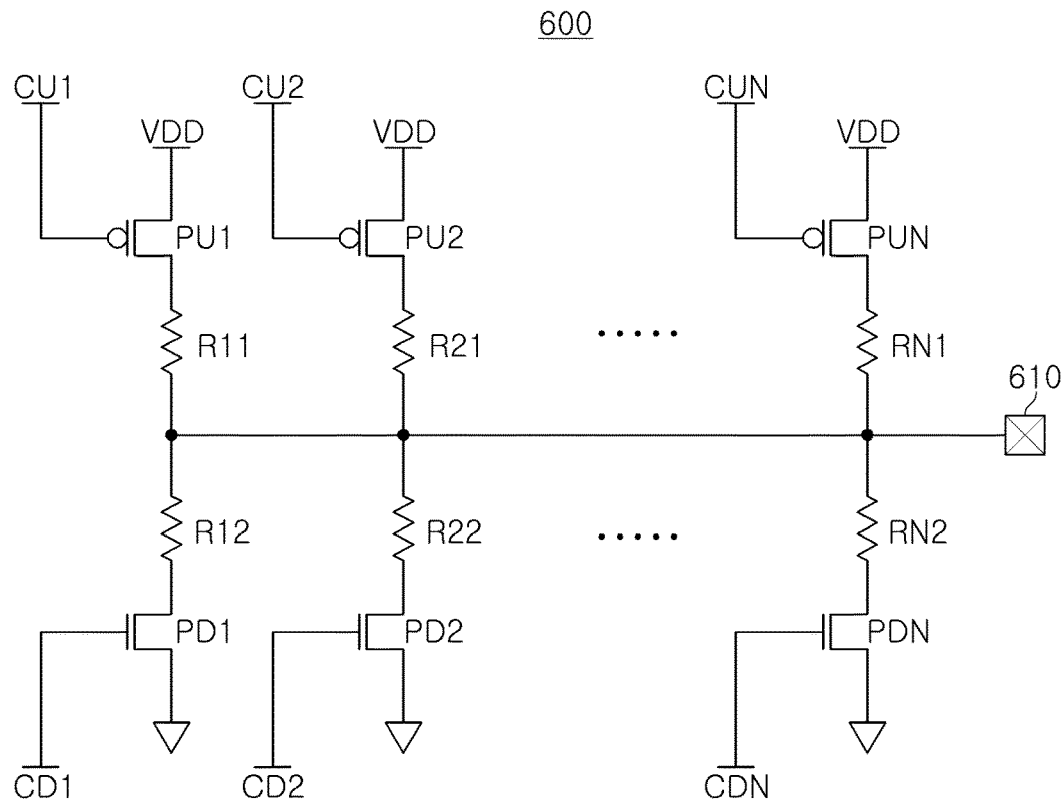
FIG. 10 is a timing diagram illustrating an operation of setting termination resistance in a memory device according to an embodiment of the present inventive concept.

FIG. 10 is a timing diagram illustrating an operation of setting termination resistance in a memory device according to an embodiment of the present inventive concept. FIG. 10 is a circuit illustrating an embodiment of a resistor circuit 600 included in an ODT circuit. Referring to FIG. 10, a resistor circuit 600 according to an embodiment of the present inventive concept may include a plurality of pull-up transistors PU1 to PUN, a plurality of pull-up resistors R11 to RN1, a plurality of pull-down transistors PD1 to PDN, and a plurality of pull-down resistors R12 to RN2. An output terminal of the resistor circuit 600 may be connected to a signal pad 610. For example, the signal pad 610 may be a pad for transmitting and receiving a signal to and from the host.

The plurality of pull-up transistors PU1 to PUN may be turned on or off by pull-up control signals CU1 to CUN, respectively. In addition, the plurality of pull-down transistors PD1 to PDN may be turned on or off by pull-down control signals CD1 to CDN, respectively. Resistance of the resistor circuit 600 may be determined by controlling on/off of the plurality of pull-up transistors PU1 to PUN and the plurality of pull-down transistors PD1 to PDN.

The pull-up control signals CU1 to CUN and the pull-down control signals CU1 to CUN for determining the on/off switching of the plurality of pull-up transistors PU1 to PUN and the plurality of pull-down transistors PD1 to PDN may be determined by an ODT setting circuit included in the ODT circuit, together with the resistor circuit 600. For example, the ODT setting circuit may determine the pull-up control signals CU1 to CUN and the pull-down control signals CU1 to CUN, based on first data received from a host, an ODT flag signal received from the other memory device, or the like, and may control a magnitude of ODT resistance provided by the resistor circuit 600.

Figure 11:
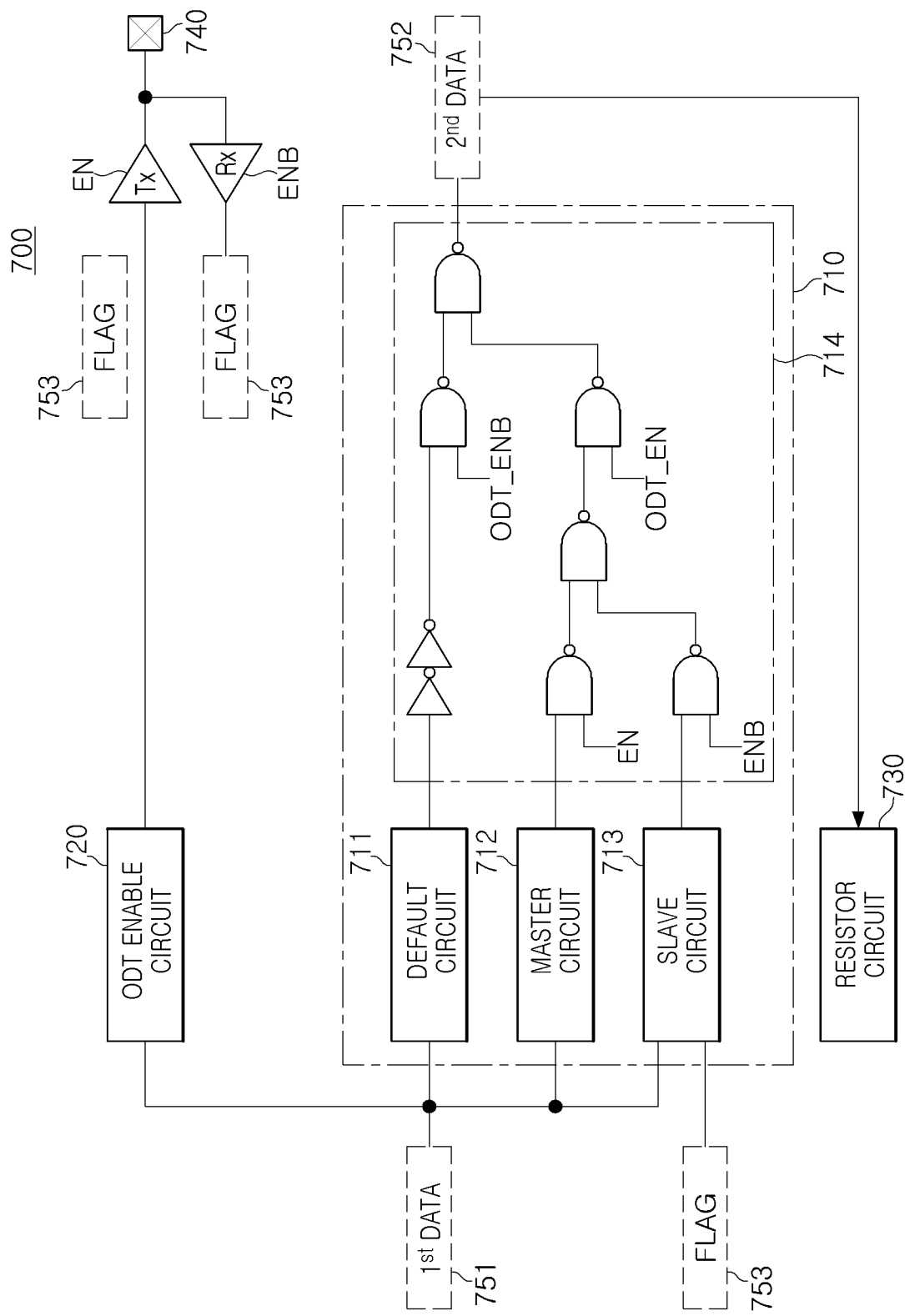
FIGS. 11 to 13 are views illustrating an ODT circuit included in a memory device according to an embodiment of the present inventive concept.
Figure 12:
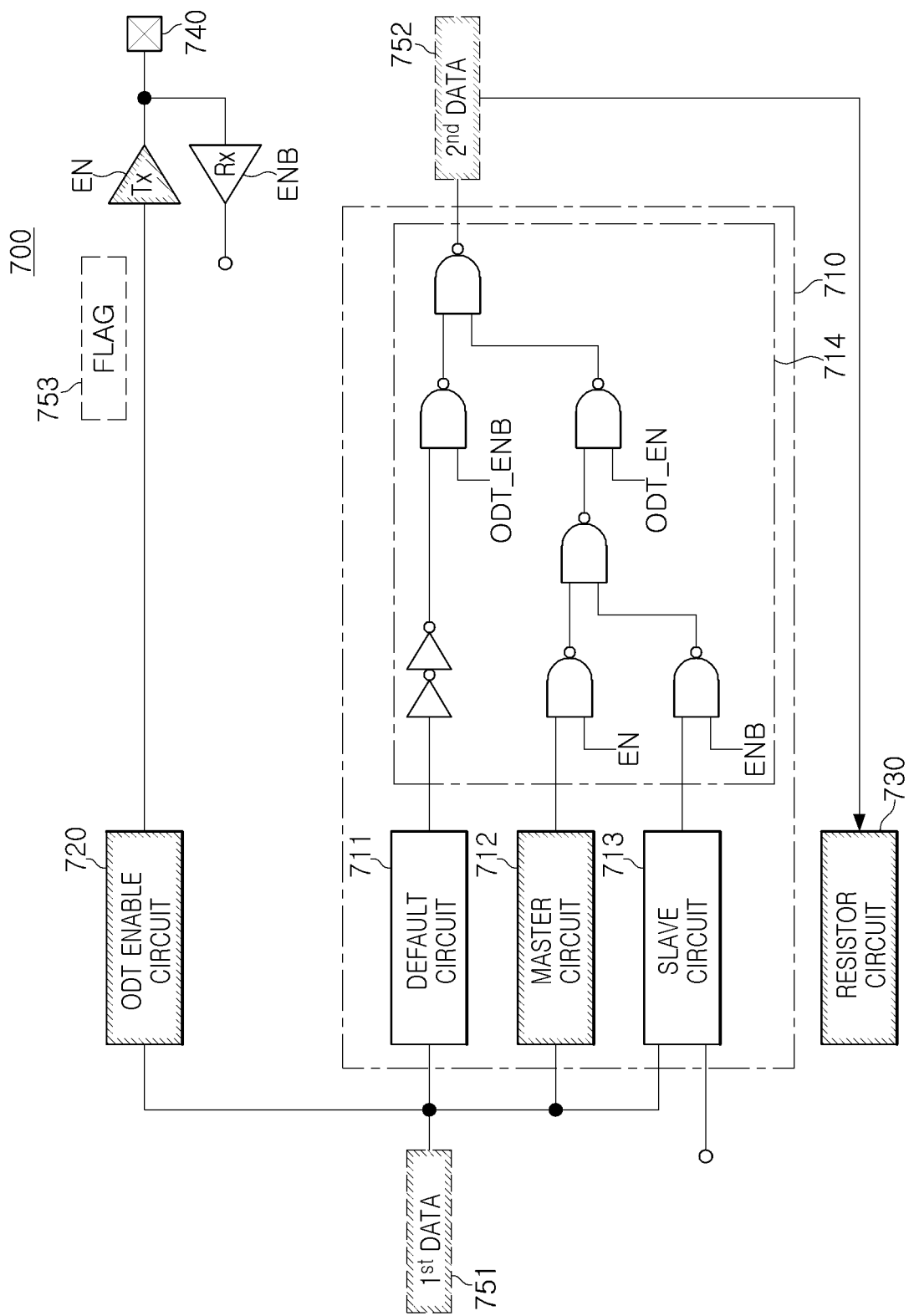
Figure 13:
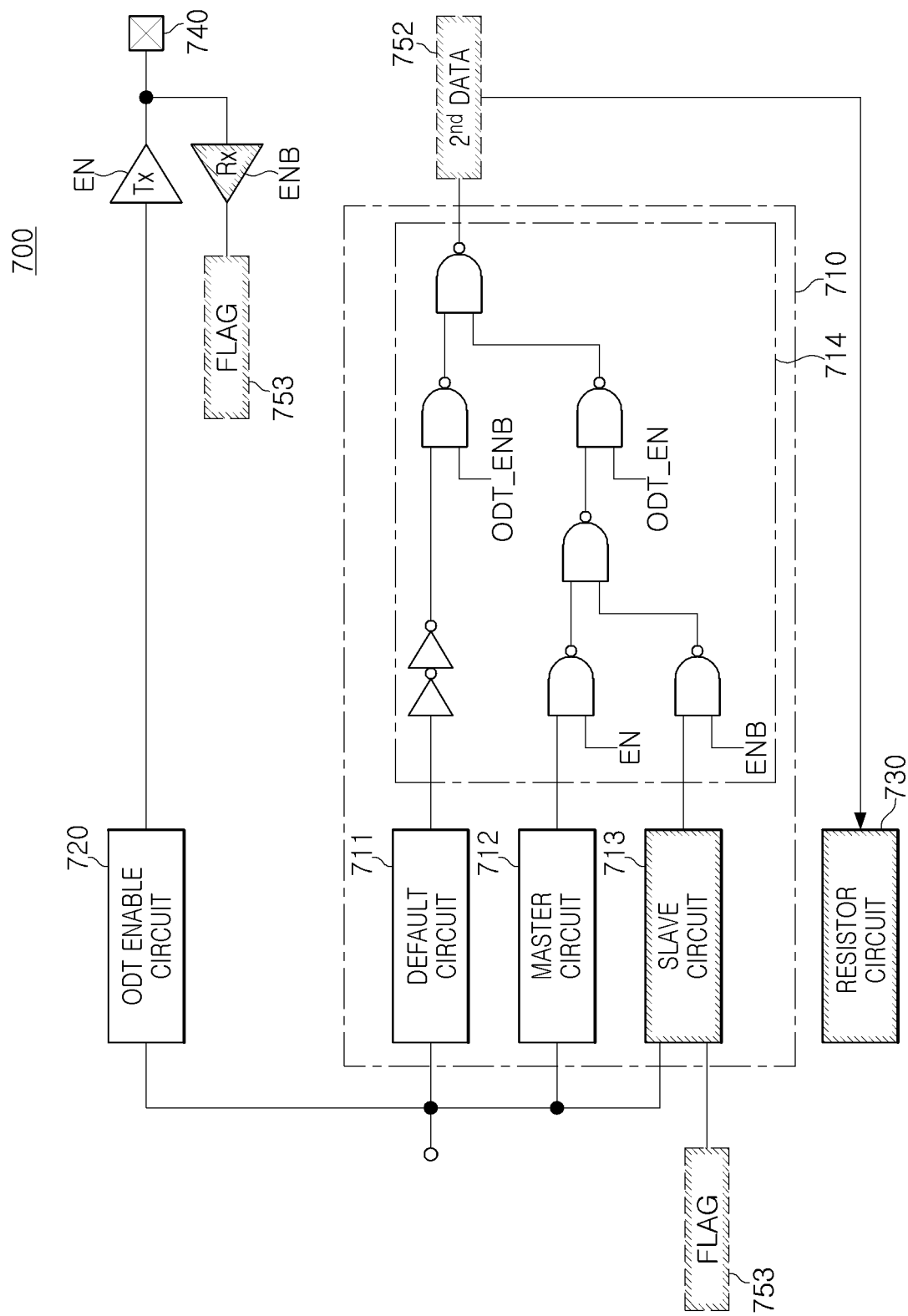

FIGS. 11 to 13 are views illustrating an ODT circuit included in a memory device according to an embodiment of the present inventive concept. Referring to FIGS. 11 to 13, an ODT circuit 700 of a memory device according to an embodiment of the present inventive concept may include an ODT setting circuit 710, an ODT enable circuit 720, a resistor circuit 730, and the like. The ODT setting circuit 710 may include a default circuit 711, a master circuit 712, a slave circuit 713, and a common circuit 714 connected to output terminals of the circuits 711 to 713. The common circuit 714 may include a buffer, a plurality of logic gates, and the like.

The default circuit 711 may be activated, when the memory device including the ODT circuit 700 receives an ODT request from a host and when termination resistance corresponding to first data 751 received together with the ODT request is equal to or higher than predetermined reference resistance. When the default circuit 711 is activated, the ODT setting circuit 710 may output the first data 751 as it is, as second data 752. Therefore, the ODT resistance provided by the resistor circuit 730 may be equal to the termination resistance requested by the host.

The master circuit 712 may be activated when the memory device including the ODT circuit 700 receives the ODT request from the host and when the termination resistance corresponding to the first data 751 received together with the ODT request is equal to or lower than the predetermined reference resistance. When the master circuit 712 is activated, the ODT setting circuit 710 may generate second data 752 corresponding to the ODT resistance, different from the termination resistance, and output the second data 752. In an example, the ODT resistance corresponding to the second data 752 output by the master circuit 712 may be higher than the termination resistance requested by the host.

The ODT enable circuit 720 may be activated when the memory device including the ODT circuit 700 receives the ODT request from the host and when the termination resistance corresponding to the first data 751 is lower than the reference resistance. The ODT enable circuit 720 may output an ODT flag signal 753 via the transmitter Tx turned on by the ODT enable signal (EN). The ODT flag signal 753 may be output to a flag pad 740.

The slave circuit 713 may be activated, when the memory device including the ODT circuit 700 does not receive the ODT request from the host. For example, when the memory device including the ODT circuit 700 does not receive the ODT request from the host, the inverted ODT enable signal (ENB) may turn on the receiver Rx. When the receiver Rx receives the ODT flag signal 753 from the other memory device via the flag pad 740, the ODT flag signal 753 may be input to the slave circuit 713.

The slave circuit 713 receiving the ODT flag signal 753 may output the second data 752 such that the resistor circuit 730 may provide ODT resistance of a predetermined magnitude. In an example, the ODT resistance corresponding to the second data 752 generated by the slave circuit 713 may include a constant resistance value, regardless of the termination resistance requested by the host.

FIG. 12 may correspond to an embodiment in which the memory device including the ODT circuit 700 receives the ODT request from the host. Referring to FIG. 12, the ODT circuit 700 may receive the first data 751 corresponding to the termination resistance requested by the host. When receiving the first data 751, the ODT enable circuit 720 may compare the termination resistance with the predetermined reference resistance. For example, when the termination resistance is lower than the reference resistance, the ODT enable circuit 720 may set the ODT flag signal 753 as a high logic value, and may output the ODT flag signal 753. The transmitter Tx may output the ODT flag signal 753 via the flag pad 740. The ODT flag signal 753 may be a signal representing one bit of data.

The flag pad 740 may be connected to a flag pad of the other memory device included in the memory package, such as a memory device including the ODT circuit 700. Therefore, the ODT flag signal 753 may be transmitted to an ODT circuit of the other memory device that has not received the ODT request from the host.

Furthermore, when the termination resistance included in the first data 751 is lower than the reference resistance, the master circuit 712 may be activated. The master circuit 712 may generate second data 752 corresponding to the ODT resistance that may be lower than the termination resistance. The ODT setting circuit 710 may output the second data 752 to the resistor circuit 730, and the resistor circuit 730 may use the second data to connect the ODT resistance to a signal pad of the memory device. The signal pad may be a pad for transmitting and receiving a signal to and from the host, which sent the ODT request.

When the termination resistance is equal to or higher than the reference resistance, the ODT enable circuit 720 may set the ODT flag signal 753 as a low logic value. Contrary to those illustrated in FIG. 12, the default circuit 711, not the master circuit 712, may be activated, and ODT resistance corresponding to the second data 752 may be equal to the termination resistance corresponding to the first data 751. For example, when the default circuit 711 is activated, the second data 752 may be equal to the first data 751.

FIG. 13 may correspond to a case in which the memory device including the ODT circuit 700 is a memory device that has not received the ODT request from the host. Referring to FIG. 13 and comparing to FIG. 12, the ODT circuit 700 may not receive the first data 751 from the host, and the receiver Rx may receive the ODT flag signal 753 via the flag pad 740. As described with reference to FIG. 12, the ODT flag signal 753 may be a signal output from the memory device that receives the ODT request from the host. In an embodiment, the ODT flag signal 753 may have a high logic value, when the termination resistance requested by the host is lower than the reference resistance.

The ODT flag signal 753 may be input to the slave circuit 713 of the ODT setting circuit 710. For example, when the ODT flag signal 753 having a high logic value is input to the slave circuit 713, the slave circuit 713 may output second data 752 corresponding to predetermined ODT resistance. In the embodiment illustrated in FIG. 13, the ODT resistance corresponding to the second data 752 may have a constant size, regardless of the termination resistance requested by the host. The resistor circuit 730 may connect the ODT resistance, determined by the second data 752, to a signal pad.

Figure 14:
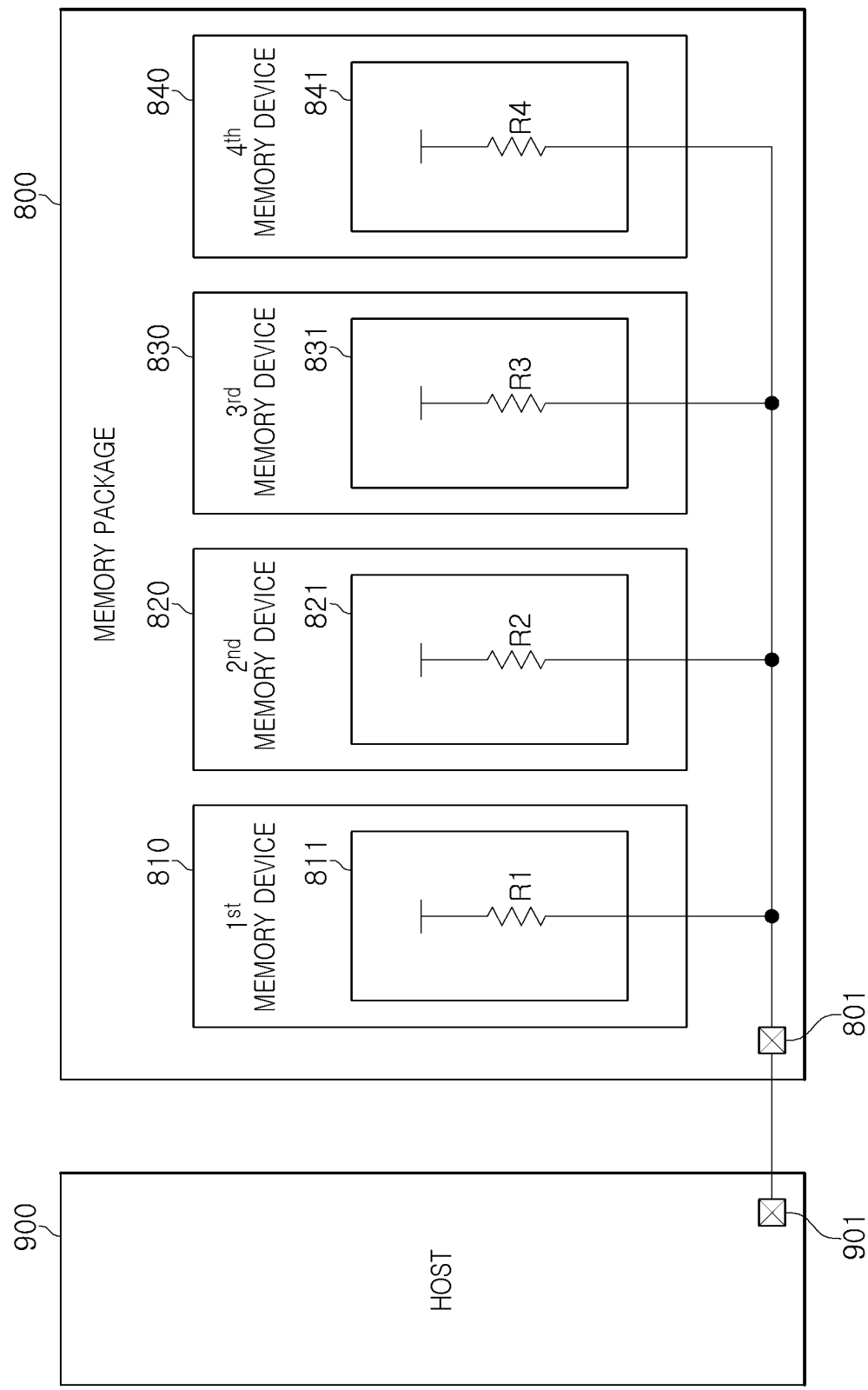
FIG. 14 is a view illustrating an operation of a memory package according to an embodiment of the present inventive concept.

FIG. 14 is a view illustrating an operation of a memory package according to an embodiment of the present inventive concept. Referring to FIG. 14, a memory package 800 according to an embodiment of the present inventive concept may include a plurality of memory devices 810 to 840, and each of the plurality of memory devices 810 to 840 may include ODT circuits 811, 821, 831, and 841. The ODT circuits 811, 821, 831, and 841 may share a signal pad 801, and the signal pad 801 may be connected to a pad 901 of a host 900.

When the host 900 selects one of the memory devices 810 to 840 to transmit an ODT request, and sends a signal through the signal pad 801, the reflection of a signal may occur in the memory device to deteriorate signal integrity. For example, when only the first ODT circuit 811 of the first memory device 810, receiving the ODT request, connects first ODT resistance R1 to the signal pad 801, and when the second to fourth ODT circuits 821, 831, and 841 do not connect second to fourth ODT resistances R2 to R4 to the signal pad 801, the signal may be reflected in the second to fourth memory devices 820 to 840.

In an embodiment of the present inventive concept, the first ODT circuit 811 of the first memory device 810 may send an ODT flag signal to the second to fourth ODT circuits 821, 831, and 841 of the unselected second to fourth memory devices 820 to 840. In response to the ODT flag signal, the second to fourth ODT circuits 821, 831, and 841 may connect the second to fourth ODT resistances R2 to R4 to the pad 801, and may minimize the reflection of signal. For example, the ODT flag signal may be sent via a flag pad, different from the signal pad 801, and may be a flag signal of 1 bit. The flag pad may be a pad, separated from the host 900.

The first ODT circuit 811 may operate, in the same manner to the ODT circuit 700 described with reference to FIG. 12. The second to fourth ODT circuits 821, 831, and 841 may operate, in the same manner to the ODT circuit 700 described with reference to FIG. 13. The first to fourth ODT resistances R1 to R4 provided by each of the ODT circuits 811, 821, 831, and 841 may be determined according to the termination resistance requested by the host 900, as illustrated in Table 1 below.

TABLE 1

| Termination Resistance (ohm) | R1 (ohm) | R2 (ohm) | R3 (ohm) | R4 (ohm) |
|---|---|---|---|---|
| 40 | 80 | 240 | 240 | 240 |
| 48 | 120 | 240 | 240 | 240 |
| 60 | 240 | 240 | 240 | 240 |
| 80 | OFF | 240 | 240 | 240 |
| 120 | 120 | OFF | OFF | OFF |
| 240 | 240 | OFF | OFF | OFF |

In Table 1 above, OFF may correspond to a case in which the ODT resistance is not connected to the signal pad 801. Referring to Table 1 above, when the termination resistance is lower than predetermined reference resistance, the second to fourth ODT circuits 821, 831, and 841 included in the unselected second to fourth memory devices 820 to 840 may be activated to connect the second to fourth ODT resistances R2 to R4 to the signal pad 801. In an embodiment illustrated in Table 1, the reference resistance may be set to a value higher than 80 ohms and equal to or lower than 120 ohms, but is not necessarily limited to such resistance values. In addition, the second to fourth ODT resistances R2 to R4 may have a constant value, regardless of the termination resistance. For example, when the termination resistance is lower than the reference resistance, the second to fourth ODT circuits 821, 831, and 841 included in the second to fourth memory devices 820 to 840 may have the same size.

When the termination resistance is lower than the reference resistance, the first ODT resistance R1 provided by the first ODT circuit 811 of the first memory device 810, which receives the ODT request from the host 900, may be higher than the termination resistance. A value of the first ODT resistance R1 may be set such that the composite resistance of the first to fourth ODT resistances R1 to R4 has the termination resistance requested by the host 900. As described above, since the second to fourth ODT resistances R2 to R4 have a constant value, regardless of the termination resistance, the first ODT circuit 811 may uses the termination resistances to determine the value of the first ODT resistance R1.

Figure 15:
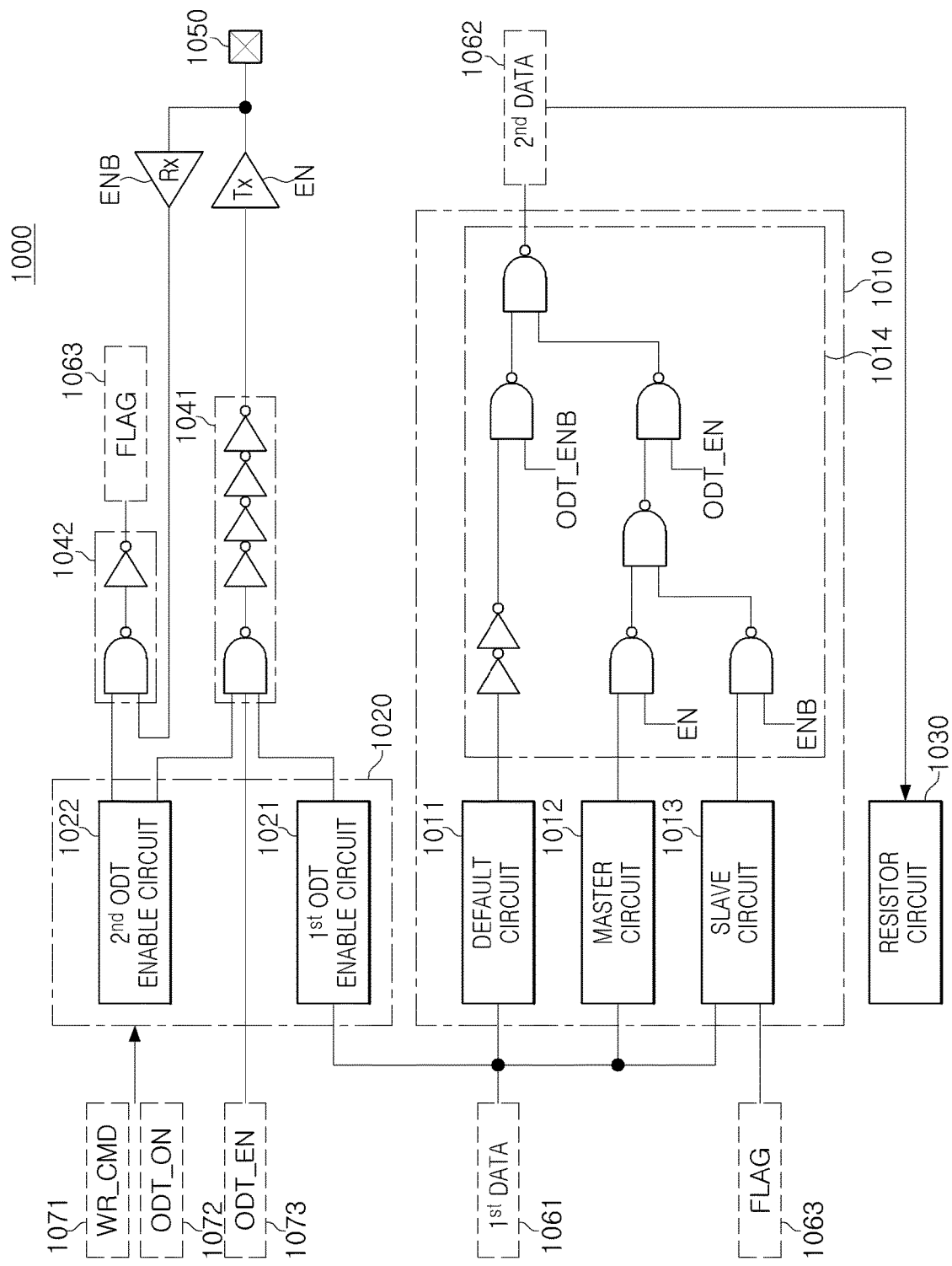
FIGS. 15 to 17 are views illustrating an ODT circuit included in a memory device according to an embodiment of the present inventive concept.
Figure 16:
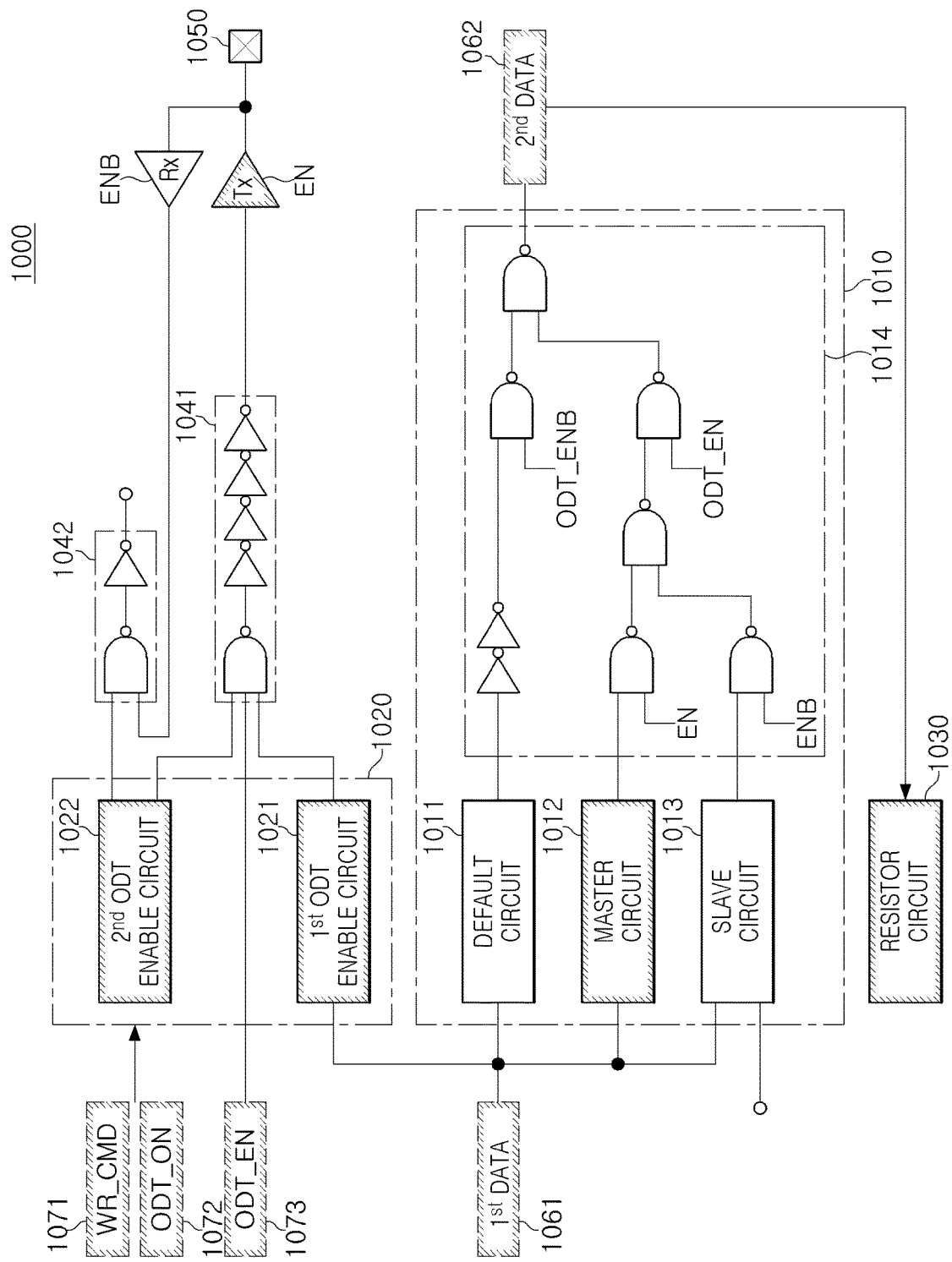
Figure 17:
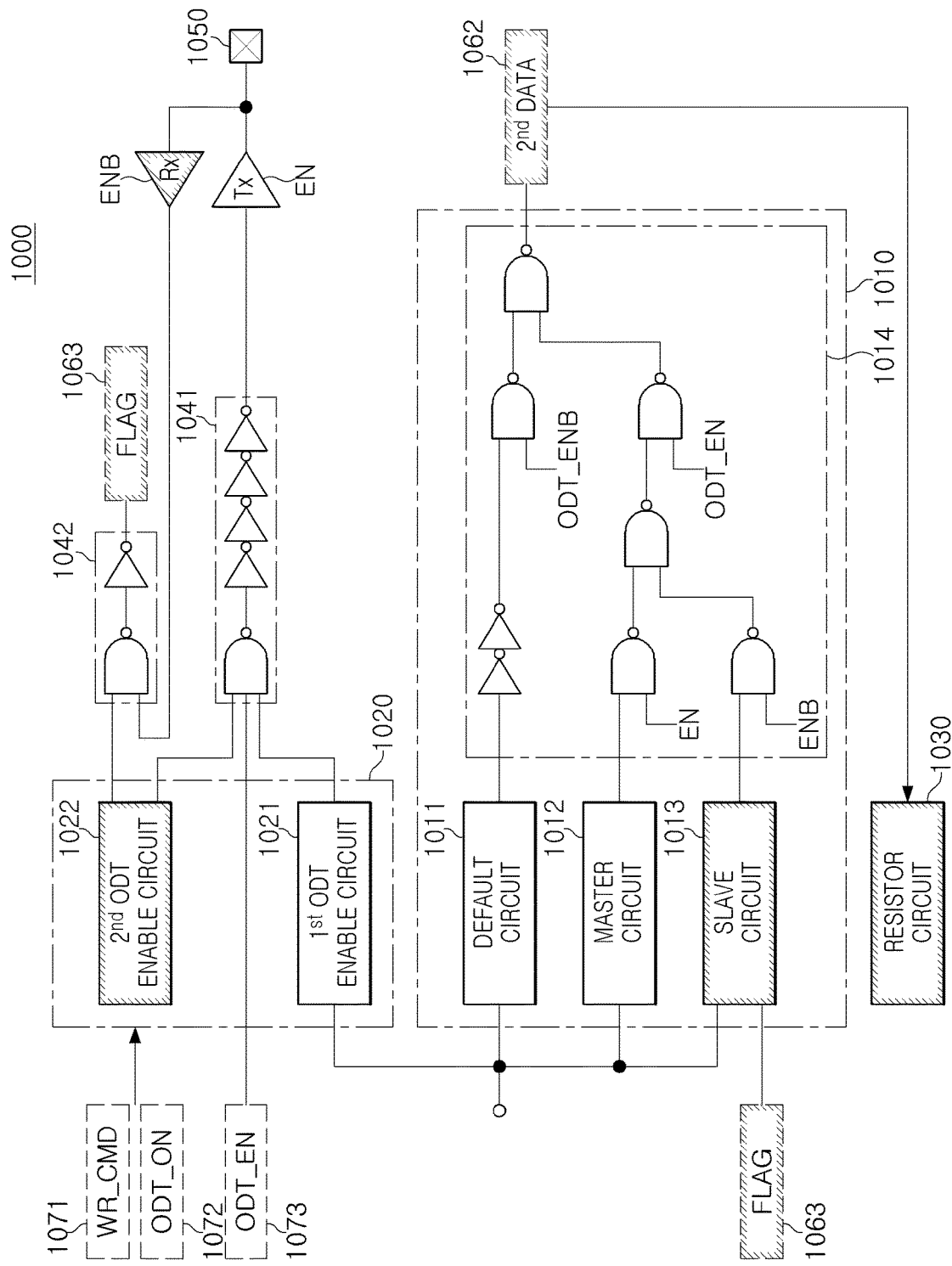

FIGS. 15 to 17 are views illustrating an ODT circuit included in a memory device according to an embodiment of the present inventive concept. In an embodiment of the present inventive concept illustrated in FIGS. 15 to 17, an ODT circuit 1000 may include an ODT setting circuit 1010, an ODT enable circuit 1020, a resistor circuit 1030, a transmitter Tx, a receiver Rx, and the like. Alternatively, when a memory device including the ODT circuit 1000 receives an ODT request from a host, an ODT enable signal (EN) may turn on the transmitter Tx, and an inverted ODT enable signal (ENB) may turn off the receiver Rx. When the memory device including the ODT circuit 1000 does not receive the ODT request from the host, the receiver Rx may be turned on and the transmitter Tx may be turned off.

In an embodiment, the ODT circuit 1000 described with reference to FIGS. 15 to 17 may be a circuit for providing termination resistance requested by the host, when a data signal, a data strobe signal, or the like is transmitted to and received from the host. For example, the ODT circuit 1000 may be activated when receiving a data writing command 1071 and an ODT on signal 1072 from the host, and the ODT circuit 1000 may not operate in a data reading operation.

When the memory device including the ODT circuit 1000 receives the ODT request from the host, the ODT setting circuit 1010 may receive first data 1061. The ODT setting circuit 1010 may include a default circuit 1011, a master circuit 1012, a slave circuit 1013, a common circuit 1014, and the like. The common circuit 1014 may be connected to output terminals of the default circuit 1011, the master circuit 1012 and the slave circuit 1013, and may output second data 1062.

In an example, the first data 1061 may be data received by the memory device including the ODT circuit 1000, together with the ODT request from the host, and may be data corresponding to the termination resistance requested by the host. The second data 1062 may be sent to the resistor circuit 1030, and the resistor circuit 1030 may use the second data 1062 to connect the ODT resistance to a signal pad to or from which the data signal, the data strobe signal, or the like is transmitted or received.

The ODT enable circuit 1020 may include a first ODT enable circuit 1021 and a second ODT enable circuit 1022. The first ODT enable circuit 1021 may operate when receiving the first data 1061 and when the termination resistance included in the first data 1061 is lower than predetermined reference resistance.

The output terminals of the first ODT enable circuit 1021 and the second ODT enable circuit 1022 may be connected to a transmitter control circuit 1041 and a receiver control circuit 1042. The transmitter control circuit 1041 may receive an entire ODT on signal 1073, together with outputs of the first ODT enable circuit 1021 and the second ODT enable circuit 1022. The entire ODT on signal 1073 may be a signal for activating an ODT of all the memory devices sharing the signal pad to or from which the data signal, the data strobe signal, or the like is transmitted or received.

The receiver control circuit 1042 may use an output of the receiver Rx and an output of the second ODT enable circuit 1022 to generate an ODT flag signal 1063, when the receiver Rx is turned on. The ODT flag signal 1063 may be a one-bit flag signal. The ODT flag signal 1063 may be input to the slave circuit 1013, and the slave circuit 1013 may generate the second data 1062. When the slave circuit 1013 generates the second data 1062, the resistor circuit 1030 may connect constant ODT resistance to the signal pad, regardless of the termination resistance requested by the host.

FIG. 16 may correspond to a case in which the memory device including the ODT circuit 1000 receives the ODT request from the host. The memory device including the ODT circuit 1000 in an embodiment may receive the data write command 1071, the ODT on signal 1072, and the entire ODT on signal 1073 from the host. Referring to FIG. 16, the ODT circuit 1000 may receive the first data 1061 from the host, and the first data 1061 may include data corresponding to the termination resistance requested by the host.

The first ODT enable circuit 1021 may compare the termination resistance included in the first data 1061 with predetermined reference resistance. When the termination resistance is lower than the reference resistance, an output of the first ODT enable circuit 1021 may be determined as a logic value by which the ODT circuit of the other memory devices may be activated by a signal output by the transmitter Tx.

Further, when the termination resistance included in the first data 1061 is lower than the reference resistance, the master circuit 1012 may be activated. The master circuit 1012 may generate second data 1062 corresponding to ODT resistance, higher than the termination resistance. The ODT resistance corresponding to the second data 1062 may provide termination resistance corresponding to the first data 1061, together with the ODT resistance provided by the ODT circuit activated in the other memory device. The ODT setting circuit 1010 may output the second data 1062 to the resistor circuit 1030, and the resistor circuit 1030 may use the second data 1062 to connect the ODT resistance to the signal pad.

When the termination resistance is equal to or higher than the reference resistance, an output of the first ODT enable circuit 1021 may be determined as a logic value by which the ODT circuit of the other memory devices may be inactivated. A signal through which the transmitter Tx outputs through a flag pad 1050 may be transferred directly to a flag pad of the other memory device that has not received the ODT request from the host.

When the termination resistance is equal to or higher than the reference resistance, unlike the embodiment illustrated in FIG. 16, the default circuit 1011, not the master circuit 1012, may be activated. When the default circuit 1011 is activated, the second data 1062 may be the same as the first data 1061. Therefore, the ODT resistance of the resistor circuit 1030 may be equal to the termination resistance corresponding to the first data 1061.

FIG. 17 may correspond to a case in which the memory device including the ODT circuit 1000 is a memory device that has not received the ODT request from the host. Referring to FIG. 17 and comparing to FIG. 16, the ODT circuit 1000 may not receive the first data 1061 from the host, the transmitter Tx may be turned off by the ODT enable signal (EN), and the receiver Rx may be turned on by the inverted ODT enable signal (ENB).

In the ODT circuit 1000, the first ODT enable circuit 1021 may not operate, and the second ODT enable circuit 1022 may operate. Due to an output of the second ODT enable circuit 1022 and a signal by which the receiver Rx is received through the flag pad 1050, the ODT flag signal 1063 may have a high logic value, and the slave circuit 1013 may operate. The slave circuit 1013 may set the ODT resistance as a previously stored value, and may generate the second data 1062 corresponding to the ODT resistance. For example, the previously stored value in the slave circuit 1013 may be higher than or equal to the termination resistance requested by the host.

Figure 18:
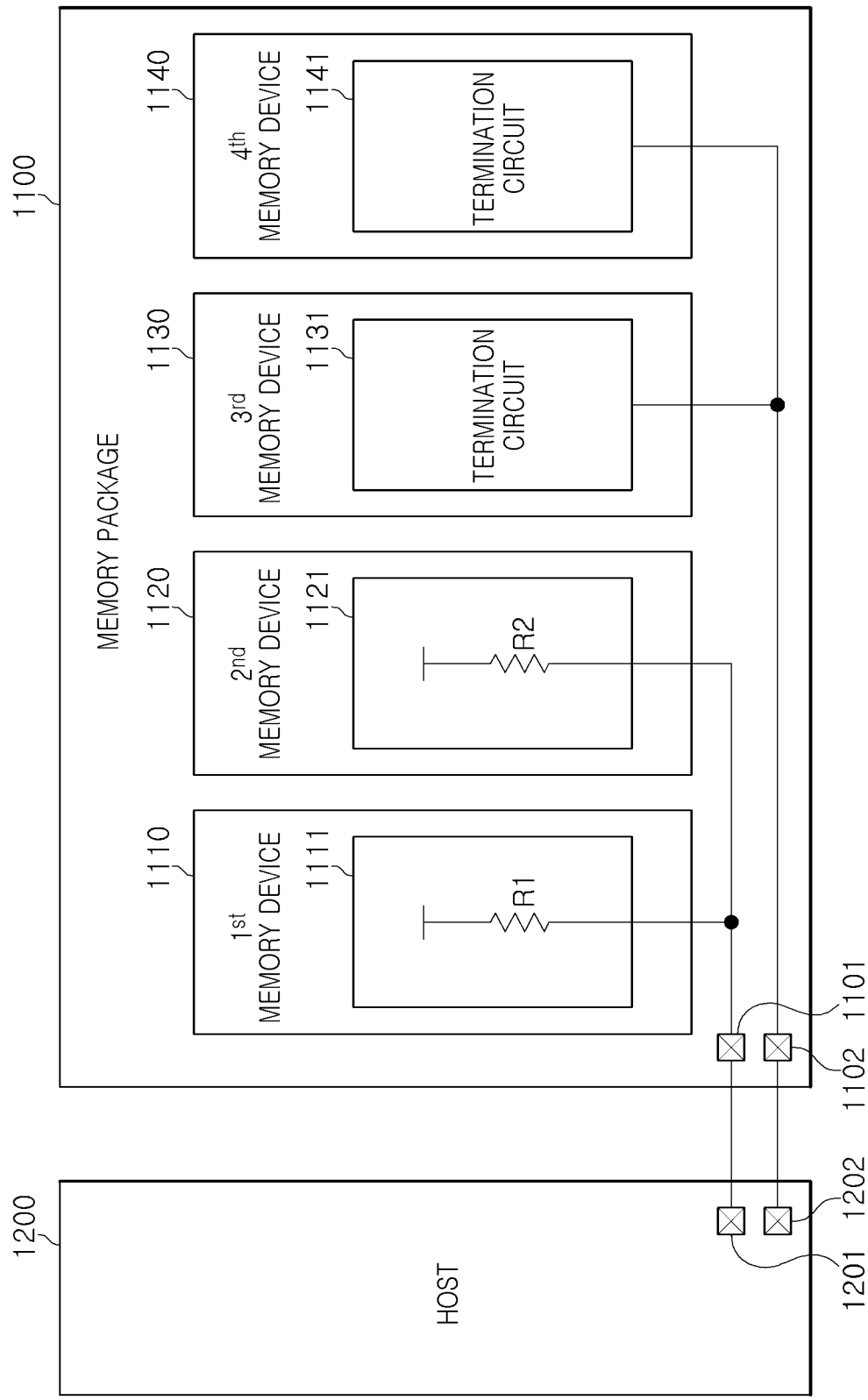
FIGS. 18 and 19 are views illustrating an operation of a memory package according to an embodiment of the present inventive concept.
Figure 19:
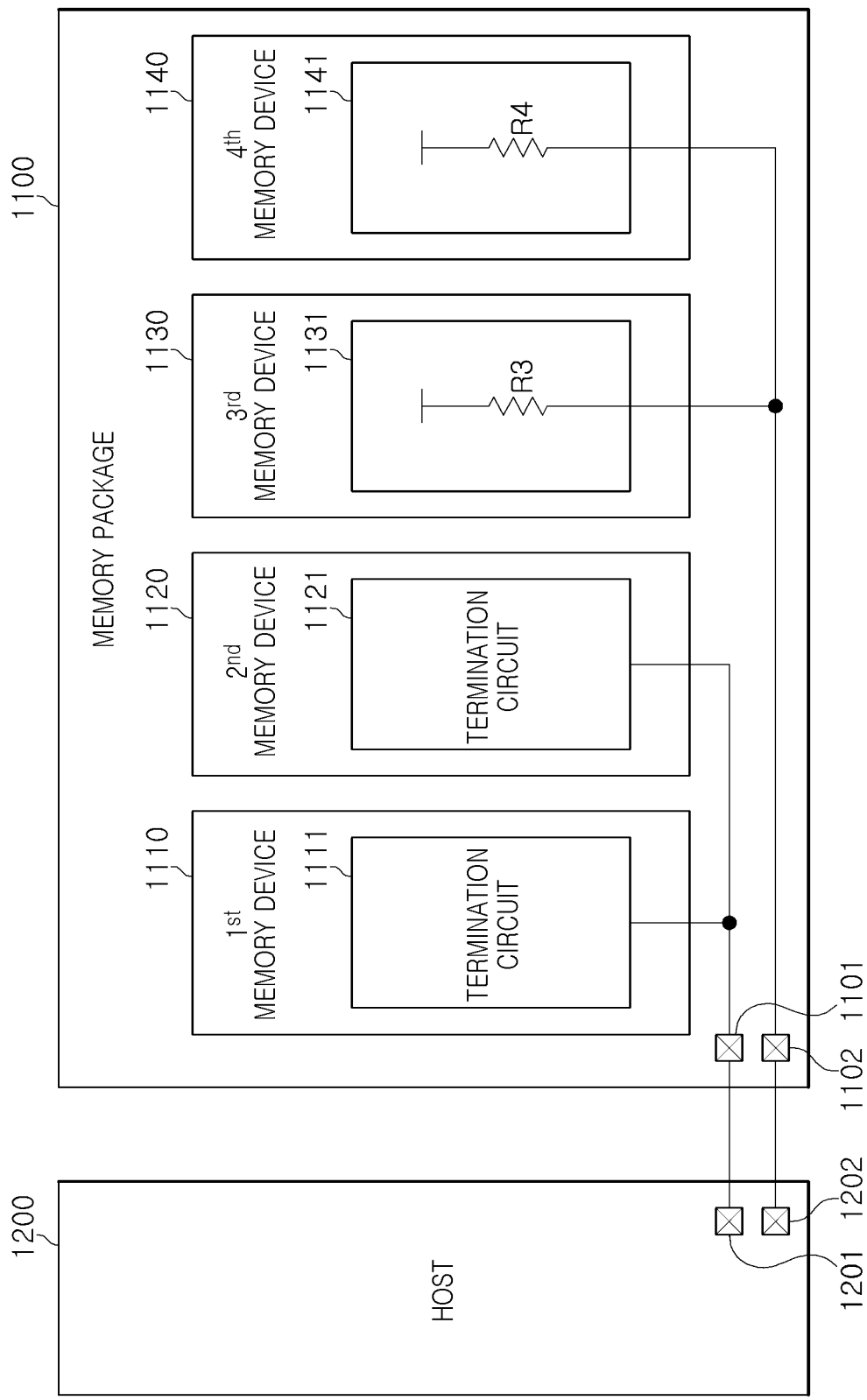

FIGS. 18 and 19 are views illustrating an operation of a memory package according to an embodiment of the present inventive concept. Referring to FIGS. 18 and 19, a memory package 1100 according to an embodiment of the present inventive concept may include a plurality of memory devices 1110 to 1140, and each of the plurality of memory devices 1110 to 1140 may include ODT circuits 1111, 1121, 1131, and 1141. The first and second ODT circuits 1111 and 1121 may share a first signal pad 1101, and the third and fourth ODT circuits 1131 and 1141 may share a second signal pad 1102. The first signal pad 1101 and the second signal pad 1102 may be connected to a first pad 1201 and a second pad 1202 of a host 1200, respectively.

In an embodiment, the first signal pad 1101 and the second signal pad 1102 of the memory package 1100 may be pads for transmitting and receiving a data signal, a data strobe signal, or the like. In an embodiment, the first memory device 1110 and the second memory device 1120, sharing the first signal pad 1101, may be classified as a different rank from that of the third memory device 1130 and the fourth memory device 1140, sharing the second signal pad 1102.

FIG. 18 may correspond to an embodiment in which the host 1200 selects at least one of the first memory device 1110 and the second memory device 1120 to execute a data writing command. Referring to FIG. 18, the first ODT circuit 1111 of the first memory device 1110 and the second ODT circuit 1121 of the second memory device 1120 may all be activated to minimize the reflection of signal and improve the signal integrity. The first ODT resistance R1 and the second ODT resistance R2 may be set such that a composite resistance of first ODT resistance R1 and second ODT resistance R2 corresponds to the termination resistance requested by the host 1200.

The host 1200 may transfer the ODT request, together with the data writing command, to one of the first memory device 1110 and the second memory device 1120. For example, when the host 1200 transfers the ODT request to the first memory device 1110, an operation of the first ODT circuit 1111 may be the same as the operation of the ODT circuit 1000 described above with reference to FIG. 16. An operation of the second ODT circuit 1121 of the second memory device 1120 that has not received the ODT request from the host 1200 may be the same as the operation of the ODT circuit 1000 described above with reference to FIG. 17. In an embodiment, the first and second ODT resistances R1 and R2 provided by each of the first and second ODT circuits 1111 and 1121 may be determined according to the termination resistance requested by the host 1200, as illustrated in Table 2 below.

TABLE 2

| Termination Resistance (ohm) | R1 (ohm) | R2 (ohm) |
| --- | --- | --- |
| 40 | 80 | 80 |
| 48 | 120 | 80 |
| 60 | 240 | 80 |
| 80 | OFF | 80 |
| 120 | 120 | OFF |
| 240 | 240 | OFF |

As illustrated in Table 2 above, when the termination resistance is lower than predetermined reference resistance, the second ODT circuit 1121 included in the second memory device 1120 may be activated by the first memory device 1110. In an embodiment illustrated in Table 2, a value of the reference resistance may be higher than 80 ohms and equal to or lower than 120 ohms. In addition, the second resistor R2 provided by the second ODT circuit 1121 may have a constant value, regardless of the termination resistance requested by the host 1200.

When the termination resistance is lower than the reference resistance, the first ODT resistance R1 of the first ODT circuit 1111 included in the first memory device 1110, to which the host 1200 transfers the ODT request, may be lower than the termination resistance. A size of the first ODT resistance R1 may be set such that composite resistance of the first and second ODT resistances R1 and R2 may be equal to the termination resistance requested by the host 1200. As described above, since the second ODT resistance R2 has a constant size, regardless of the termination resistance, the first ODT circuit 1111 may use the termination resistance to determine the size of the first ODT resistance R1.

FIG. 19 may correspond to an embodiment in which the host 1200 selects at least one of the third memory device 1130 and the fourth memory device 1140 to execute a data writing command. In FIG. 19, in a similar manner to the embodiment illustrated in FIG. 18, the third ODT circuit 1131 of the third memory device 1130 and the fourth ODT circuit 1141 of the fourth memory device 1140 may all be activated to reduce the reflection of signal and improve the signal integrity. Composite resistance of the third ODT resistance R3 and the fourth ODT resistance R4 may be equal to the termination resistance requested by the host 1200.

Figure 20:
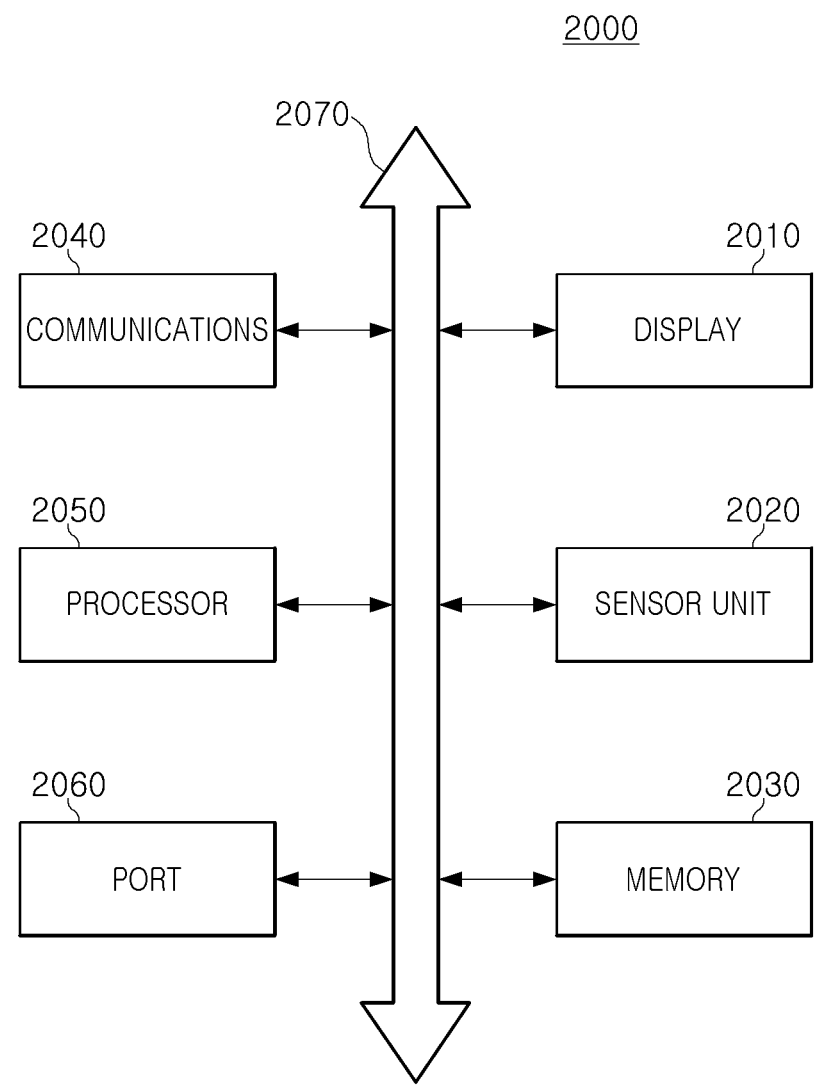
FIG. 20 is a block diagram schematically illustrating an electronic device including a memory device according to an embodiment of the present inventive concept.

FIG. 20 is a block diagram schematically illustrating an electronic device including a memory device according to an embodiment of the present inventive concept. An electronic device 2000 according to an embodiment illustrated in FIG. 20 may include a display 2010, a sensor unit 2020, a memory 2030, a communications unit 2040, a processor 2050, and a port 2060. In addition, the electronic device 2000 may further include a power supply unit, an input/output unit, and the like. Among the components illustrated in FIG. 20, the port 2060 may be a device in which the electronic device 2000 is provided for communicating with a video card, a sound card, a memory card, a universal serial bus (USB) device, or the like. The electronic device 2000 may be a concept including both a general desktop computer or laptop computer, as well as a smartphone, a tablet personal computer (PC), a smart wearable device, and the like.

The processor 2050 may perform specific operations, commands, tasks, etc. The processor 2050 may be a central processing unit (CPU) or a microprocessor unit (MCU), a system on chip (SoC), etc., and may be connected to the display 2010, the sensor unit 2020, the memory 2030, the communications unit 2040, as well as to other units connected the port 2060, through a bus 2070.

The memory 2030 may be storage medium for storing data, multimedia data for operating the electronic device 2000, or the like. The memory 2030 may include a volatile memory, such as a random access memory (RAM), a non-volatile memory, such as a flash memory, or the like. The memory 2030 may also include at least one of a solid state drive (SSD), a hard disk drive (HDD), and an optical disc drive (ODD) as a storage unit. In an embodiment illustrated in FIG. 20, the memory 2030 may include a memory device or a memory package according to various embodiments described above with reference to FIGS. 1 to 19.

According to an embodiment of the present inventive concept, a memory device receiving an ODT enable signal from a host, among two or more memory devices being simultaneously driven, may transfer an ODT flag signal to remaining memory devices. The remaining memory devices receiving the ODT flag signal may connect predetermined ODT resistance to the host. The ODT resistance of the memory device that has received the ODT enable signal from the host may be set such that composite resistance of the ODT resistances connected to the host matches termination resistance requested by the host. Therefore, the reflection of signal in memory devices driven by a host may be minimized to reduce signal distortion, and the signal integrity and/or the eye margin may increase to improve performance of a memory device and a memory package.

The various and advantageous advantages and effects of the present inventive concept may be not limited to the above description, and may be more easily understood in the course of describing a specific embodiment of the present inventive concept.

While the present inventive concept has been illustrated and described with reference to example embodiments thereof, it will be apparent to those skilled in the art that modifications and variations could be made thereto without departing from the scope of the present inventive concept as defined by the appended claims.

What is claimed is:

1. A memory device comprising:
a pad region having a flag pad and a signal pad thereon;
a memory bank region having a plurality of memory cells therein;
an on-die-termination (ODT) setting circuit configured to receive a control command including first data corresponding to a termination resistance requested by an external host, and an ODT enable signal, and further configured to generate second data corresponding to an ODT resistance;
an ODT enable circuit configured to output an ODT flag signal to the flag pad, in response to the control command and the ODT enable signal; and
a resistor circuit configured to connect the ODT resistance to the signal pad, in response to the second data.

2. The memory device according to claim 1, further comprising:
a transmitter having an output terminal electrically coupled to the flag pad; and
a receiver having an input terminal electrically coupled to the flag pad.

3. The memory device according to claim 2, wherein the receiver is turned off and the transmitter is turned on to thereby output the ODT flag signal, in response to receipt of the ODT enable signal by the ODT enable circuit.

4. The memory device according to claim 3, wherein the transmitter is turned off and the receiver is turned on in the absence of the ODT enable signal.

5. The memory device according to claim 2, wherein the ODT setting circuit is configured to set the ODT resistance at a pre-stored value, upon receipt of an ODT flag signal by the receiver while the transmitter is turned off.

6. The memory device according to claim 1, wherein the ODT setting circuit is configured to set the ODT resistance at a value corresponding to a termination resistance, when an operation frequency of said memory bank is less than a reference frequency, but at a value different from the termination resistance when the operation frequency is greater than the reference frequency.

7. The memory device according to claim 1, wherein the ODT setting circuit is configured to set the ODT resistance at a value corresponding to the termination resistance, when the termination resistance is greater than a reference resistance, but at a value different from the termination resistance when the termination resistance is less than the reference resistance.

8. The memory device according to claim 7, wherein the ODT enable circuit is configured to set the ODT flag signal at a low logic value when the termination resistance is higher than the reference resistance, but set the ODT flag signal at a high logic value when the termination resistance is lower than the reference resistance.

9. The memory device according to claim 1, wherein the ODT resistance is electrically coupled to the signal pad to which at least one signal of a command/address signal, a clock signal, a data signal, and a data strobe signal is received from the external host.

10. The memory device according to claim 1, wherein said memory bank region comprises an array of dynamic random access memory (DRAM) cells therein.

11. The memory device according to claim 2, wherein said ODT enable circuit has an output terminal electrically coupled to an input terminal of the transmitter; and wherein said ODT setting circuit has an input terminal electrically coupled to an output terminal of the receiver.

12. A memory package, comprising:
a package substrate having a plurality of pads thereon;
a first memory device mounted on the package substrate, and comprising first on-die-termination (ODT) resistance and a first ODT circuit, which determines a value of the first ODT resistance, wherein the first ODT circuit sets the first ODT resistance as a first resistance value and outputs an ODT flag signal, in response to an ODT request from a host; and
a second memory device mounted on the package substrate, and comprising second ODT resistance and a second ODT circuit, which determines a value of the second ODT resistance, wherein the second ODT circuit sets the second ODT resistance as a second resistance value, when receiving the ODT flag signal from the first memory device; and
wherein the first resistance value is equal to or lower than the second resistance value, when the first ODT resistance and the second ODT resistance are connected in common to a pad receiving a command/address signal and/or a clock signal from the host.

13. The memory package according to claim 12, wherein the first ODT circuit and the second ODT circuit have equivalent structure.

14. The memory package according to claim 12, wherein the first memory device and the second memory device share the plurality of pads, and the first ODT resistance and the second ODT resistance have respective terminals that are connected in common to one of the plurality of pads.

15. The memory package according to claim 12, wherein the first ODT resistance and the second ODT resistance are connected in parallel with each other, and a combine resistance of the first ODT resistance and the second ODT resistance is equivalent to the termination resistance included in the ODT request.

16. The memory package according to claim 15, wherein the termination resistance is lower than a predetermined reference resistance.

17. The memory package according to claim 12, wherein the first ODT circuit operates as a master device and the second ODT circuit operates as a slave device relative to the master device.

18. The memory package according to claim 12, wherein the first resistance value is equal to or higher than the second resistance value, when the first ODT resistance and the second ODT resistance are connected to a pad receiving a data signal and/or a data strobe signal.

19. A memory device comprising:
a resistor circuit providing on-die-termination (ODT) resistance connected to a pad receiving a signal from an external host;
an ODT setting circuit configured to control the resistor circuit such that the ODT resistance has a value greater than a termination resistance, when the termination resistance included in an ODT request received from the host is lower than predetermined reference resistance; and
an ODT enable circuit configured to output an ODT flag signal when the termination resistance is lower than the reference resistance;
wherein the ODT enable circuit is configured to output the ODT flag signal to a first number of the memory device, among other memory devices, when the ODT request is received together with at least one signal of a command/address signal and a clock signal, and is further configured to output the ODT flag signal to a second number of the memory device, among other memory devices, when the ODT request is received together with at least one signal of a data signal and a data strobe signal, the second number is less than the first number.

* * * * *